(12) United States Patent
Roo et al.

(10) Patent No.: US 7,312,662 B1
(45) Date of Patent: Dec. 25, 2007

(54) CASCODE GAIN BOOSTING SYSTEM AND METHOD FOR A TRANSMITTER

(75) Inventors: Pierte Roo, Sunnyvale, CA (US); Sehat Sutardja, Los Altos Hills, CA (US)

(73) Assignee: Marvell International Ltd., Hamilton (BM)

(*) Notice: Subject to any disclaimer, the term of this patent is extended or adjusted under 35 U.S.C. 154(b) by 127 days.

(21) Appl. No.: 11/214,933

(22) Filed: Aug. 31, 2005

Related U.S. Application Data

(60) Provisional application No. 60/706,421, filed on Aug. 9, 2005.

(51) Int. Cl.
*H03F 21/00* (2006.01)

(52) U.S. Cl. .................. 330/311; 330/253

(58) Field of Classification Search ........... 330/311, 330/310, 98, 150, 253, 260, 261
See application file for complete search history.

(56) References Cited

U.S. PATENT DOCUMENTS

| | | |
|---|---|---|
| 3,297,951 A | 1/1967 | Blasbalg |
| 3,500,215 A | 3/1970 | Leuthold et al. |
| 3,521,170 A | 7/1970 | Leuthold et al. |
| 3,543,009 A | 11/1970 | Voelcher, Jr. |
| 3,793,589 A | 2/1974 | Puckette |
| 3,973,089 A | 8/1976 | Puckett |
| 4,071,842 A | 1/1978 | Tewksbury |
| 4,112,253 A | 9/1978 | Wilhelm |
| 4,131,767 A | 12/1978 | Weinstein |
| 4,152,541 A | 5/1979 | Yuen |
| RE30,111 E | 10/1979 | Blood, Jr. |
| 4,309,673 A | 1/1982 | Norberg et al. |
| 4,321,753 A | 3/1982 | Fusari |
| 4,362,909 A | 12/1982 | Snijders et al. |
| 4,393,370 A | 7/1983 | Hareyama |
| 4,393,494 A | 7/1983 | Belforte et al. |
| 4,408,190 A | 10/1983 | Nagano |
| 4,464,545 A | 8/1984 | Werner |
| 4,503,421 A | 3/1985 | Hareyama et al. |

(Continued)

FOREIGN PATENT DOCUMENTS

| | | |
|---|---|---|
| DE | 10 2004 017 497 | 11/2004 |

(Continued)

OTHER PUBLICATIONS

IEEE Standards 802.3ab-2002, "Part 3: Carrier sense multiple access with collision detection (CSMA/CD) access method and physical layer specifications", pp. 147-249.

(Continued)

*Primary Examiner*—Henry Choe

(57) ABSTRACT

A communication device includes a first polarity driver circuit. The first polarity driver circuit includes a first current source. The first polarity driver circuit includes a first amplifier. The first amplifier is arranged in a feedback configuration with the first current source. The first amplifier is configured to receive an input signal. The first polarity driver circuit includes a first cascode device. The first cascode device is arranged in a cascode configuration with the first current source. The first polarity driver circuit includes a second amplifier. The second amplifier is arranged in a feedback configuration with the first cascode device. The second amplifier is configured to receive a bias control signal.

46 Claims, 8 Drawing Sheets

U.S. PATENT DOCUMENTS

| | | | |
|---|---|---|---|
| 4,527,126 A | 7/1985 | Petrich et al. |
| 4,535,206 A | 8/1985 | Falconer |
| 4,591,832 A | 5/1986 | Fling et al. |
| 4,605,826 A | 8/1986 | Kanemasa |
| 4,621,172 A | 11/1986 | Kanemasa et al. |
| 4,621,356 A | 11/1986 | Scipione |
| 4,626,803 A | 12/1986 | Holm |
| 4,715,064 A | 12/1987 | Claessen |
| 4,727,566 A | 2/1988 | Dahlqvist |
| 4,746,903 A | 5/1988 | Czarniak et al. |
| 4,816,830 A | 3/1989 | Cooper |
| 4,817,081 A | 3/1989 | Wouda et al. |
| 4,868,571 A | 9/1989 | Inamasu |
| 4,878,244 A | 10/1989 | Gawargy |
| 4,888,762 A | 12/1989 | Arai |
| 4,894,820 A | 1/1990 | Miyamoto |
| 4,935,919 A | 6/1990 | Hiraguchi |
| 4,947,171 A | 8/1990 | Pfeifer et al. |
| 4,970,715 A | 11/1990 | McMahan |
| 4,972,360 A | 11/1990 | Cukier et al. |
| 4,988,960 A | 1/1991 | Tomisawa |
| 4,993,045 A | 2/1991 | Alfonso |
| 4,999,830 A | 3/1991 | Agazzi |
| 5,018,134 A | 5/1991 | Kokubo et al. |
| 5,043,730 A | 8/1991 | Obinnata |
| 5,084,865 A | 1/1992 | Koike |
| 5,119,365 A | 6/1992 | Warner et al. |
| 5,136,260 A | 8/1992 | Yousefi-Elezei |
| 5,148,427 A | 9/1992 | Buttle et al. |
| 5,153,450 A | 10/1992 | Ruetz |
| 5,164,725 A | 11/1992 | Long |
| 5,175,764 A | 12/1992 | Patel et al. |
| 5,185,538 A | 2/1993 | Kondoh et al. |
| 5,202,528 A | 4/1993 | Iwaooji |
| 5,204,880 A | 4/1993 | Wurster et al. |
| 5,212,659 A | 5/1993 | Scott et al. |
| 5,222,084 A | 6/1993 | Takahashi |
| 5,243,346 A | 9/1993 | Inami |
| 5,243,347 A | 9/1993 | Jackson et al. |
| 5,245,231 A | 9/1993 | Kocis et al. |
| 5,245,654 A | 9/1993 | Wilkison et al. |
| 5,248,956 A | 9/1993 | Himes et al. |
| 5,253,249 A | 10/1993 | Fitzgerald et al. |
| 5,253,272 A | 10/1993 | Jaeger et al. |
| 5,254,994 A | 10/1993 | Takakura et al. |
| 5,267,269 A | 11/1993 | Shih et al. |
| 5,269,313 A | 12/1993 | DiPinto |
| 5,272,453 A | 12/1993 | Traynor et al. |
| 5,280,526 A | 1/1994 | Latureli |
| 5,282,157 A | 1/1994 | Murphy et al. |
| 5,283,582 A | 2/1994 | Krenik |
| 5,305,379 A | 4/1994 | Takeuchi et al. |
| 5,307,064 A | 4/1994 | Kudoh |
| 5,307,405 A | 4/1994 | Sih |
| 5,323,157 A | 6/1994 | Ledzius et al. |
| 5,325,400 A | 6/1994 | Co et al. |
| 5,357,145 A | 10/1994 | Segaram |
| 5,365,935 A | 11/1994 | Righter et al. |
| 5,367,540 A | 11/1994 | Kakuishi et al. |
| 5,373,147 A | 12/1994 | Awata et al. |
| 5,375,147 A | 12/1994 | Awata et al. |
| 5,388,092 A | 2/1995 | Koyama et al. |
| 5,388,123 A | 2/1995 | Uesugi et al. |
| 5,392,042 A | 2/1995 | Pellon |
| 5,399,996 A | 3/1995 | Yates et al. |
| 5,418,478 A | 5/1995 | Van Brunt et al. |
| 5,440,514 A | 8/1995 | Flannagan et al. |
| 5,440,515 A | 8/1995 | Chang et al. |
| 5,444,739 A | 8/1995 | Uesugi et al. |
| 5,465,272 A | 11/1995 | Smith |
| 5,471,665 A | 11/1995 | Pace et al. |
| 5,479,124 A | 12/1995 | Pun et al. |
| 5,489,873 A | 2/1996 | Kamata et al. |
| 5,507,036 A | 4/1996 | Vagher |
| 5,508,656 A | 4/1996 | Jaffard et al. |
| 5,517,141 A | 5/1996 | Abdi et al. |
| 5,517,435 A | 5/1996 | Sugiyama |
| 5,521,540 A | 5/1996 | Marbot |
| 5,537,113 A | 7/1996 | Kawabata |
| 5,539,403 A | 7/1996 | Tani et al. |
| 5,539,405 A | 7/1996 | Norsworthy |
| 5,539,773 A | 7/1996 | Knee et al. |
| 5,559,476 A | 9/1996 | Zhang et al. |
| 5,568,064 A | 10/1996 | Beers et al. |
| 5,568,142 A | 10/1996 | Velazquez et al. |
| 5,572,158 A | 11/1996 | Lee et al. |
| 5,572,159 A | 11/1996 | McFarland |
| 5,577,027 A | 11/1996 | Cheng |
| 5,579,004 A | 11/1996 | Linz |
| 5,585,795 A | 12/1996 | Yuasa et al. |
| 5,585,802 A | 12/1996 | Cabler et al. |
| 5,587,681 A | 12/1996 | Fobbester |
| 5,589,788 A | 12/1996 | Goto |
| 5,596,439 A | 1/1997 | Dankberg et al. |
| 5,600,321 A | 2/1997 | Winen |
| 5,613,233 A | 3/1997 | Vagher |
| 5,625,357 A | 4/1997 | Cabler |
| 5,629,652 A | 5/1997 | Weiss |
| 5,648,738 A | 7/1997 | Welland et al. |
| 5,651,029 A | 7/1997 | Yang |
| 5,659,609 A | 8/1997 | Koizumi et al. |
| 5,663,728 A | 9/1997 | Essenwanger |
| 5,666,354 A | 9/1997 | Cecchi et al. |
| 5,684,482 A | 11/1997 | Galton |
| 5,687,330 A | 11/1997 | Gist et al. |
| 5,696,796 A | 12/1997 | Poklemba |
| 5,703,541 A | 12/1997 | Nakashima |
| 5,719,515 A | 2/1998 | Danger |
| 5,726,583 A | 3/1998 | Kaplinsky |
| 5,745,564 A | 4/1998 | Meek |
| 5,757,219 A | 5/1998 | Weedon et al. |
| 5,757,298 A | 5/1998 | Manley et al. |
| 5,760,726 A | 6/1998 | Koifman et al. |
| 5,789,981 A * | 8/1998 | Singer et al. ............... 330/253 |
| 5,790,060 A | 8/1998 | Tesch |
| 5,790,658 A | 8/1998 | Yip et al. |
| 5,796,725 A | 8/1998 | Muraoka |
| 5,798,661 A | 8/1998 | Runaldue et al. |
| 5,798,664 A | 8/1998 | Nagahori et al. |
| 5,812,597 A | 9/1998 | Graham et al. |
| 5,821,892 A | 10/1998 | Smith |
| 5,822,426 A | 10/1998 | Rasmus et al. |
| 5,825,819 A | 10/1998 | Cogburn |
| 5,834,860 A | 11/1998 | Parsons et al. |
| 5,838,177 A | 11/1998 | Keeth |
| 5,838,186 A | 11/1998 | Inoue et al. |
| 5,841,386 A | 11/1998 | Leduc |
| 5,841,809 A | 11/1998 | Koizumi et al. |
| 5,844,439 A | 12/1998 | Zortea |
| 5,859,552 A | 1/1999 | Do et al. |
| 5,864,587 A | 1/1999 | Hunt |
| 5,880,615 A | 3/1999 | Bazes |
| 5,887,059 A | 3/1999 | Xie et al. |
| 5,894,496 A | 4/1999 | Jones |
| 5,898,340 A | 4/1999 | Chatterjee et al. |
| 5,930,686 A | 7/1999 | Devline et al. |
| 5,936,450 A | 8/1999 | Unger |
| 5,940,442 A | 8/1999 | Wong et al. |
| 5,940,498 A | 8/1999 | Bardl |
| 5,949,362 A | 9/1999 | Tesche et al. |
| 5,963,069 A | 10/1999 | Jefferson et al. |
| 5,982,317 A | 11/1999 | Steensgaard-Madison |
| 5,999,044 A | 12/1999 | Wohlfarth et al. |
| 6,005,370 A | 12/1999 | Gustavson et al. |

| | | | | | | |
|---|---|---|---|---|---|---|
| 6,014,048 | A | 1/2000 | Talaga et al. | 6,389,077 B1 | 5/2002 | Chan |
| 6,037,812 | A | 3/2000 | Gaudet | 6,408,032 B1 | 6/2002 | Lye et al. |
| 6,038,266 | A | 3/2000 | Lee et al. | 6,411,647 B1 | 6/2002 | Chan |
| 6,043,766 | A | 3/2000 | Hee et al. | 6,468,032 B2 | 6/2002 | Lye et al. |
| 6,044,489 | A | 3/2000 | Hee et al. | 6,415,003 B1 | 7/2002 | Raghavan |
| 6,046,607 | A | 4/2000 | Kohdaka | 6,421,377 B1 | 7/2002 | Langberg et al. |
| 6,047,346 | A | 4/2000 | Lau et al. | 6,421,534 B1 | 7/2002 | Cook et al. |
| 6,049,706 | A | 4/2000 | Cook et al. | 6,433,608 B1 | 8/2002 | Huang |
| 6,052,076 | A | 4/2000 | Patton, III et al. | 6,441,761 B1 | 8/2002 | Viswanathan |
| 6,057,716 | A | 5/2000 | Dinteman et al. | 6,452,428 B1 | 9/2002 | Mooney et al. |
| 6,067,327 | A | 5/2000 | Creigh et al. | 6,462,688 B1 | 10/2002 | Sutardja |
| 6,087,968 | A | 7/2000 | Roza | 6,476,476 B1 | 11/2002 | Viswanathan |
| 6,094,082 | A | 7/2000 | Gaudet | 6,476,746 B2 | 11/2002 | Viswanathan |
| 6,100,830 | A | 8/2000 | Dedic | 6,476,749 B1 | 11/2002 | Yeap et al. |
| 6,121,831 | A | 9/2000 | Mack | 6,477,200 B1 | 11/2002 | Agazzi et al. |
| 6,137,328 | A | 10/2000 | Sung | 6,492,922 B1 | 12/2002 | New |
| 6,140,857 | A | 10/2000 | Bazes | 6,501,402 B2 | 12/2002 | Boxho |
| 6,148,025 | A | 11/2000 | Shirani et al. | 6,509,854 B1 | 1/2003 | Morita et al. |
| 6,150,856 | A | 11/2000 | Morzano | 6,509,857 B1 | 1/2003 | Nakao |
| 6,154,784 | A | 11/2000 | Liu | 6,531,973 B2 | 3/2003 | Brooks et al. |
| 6,163,283 | A | 12/2000 | Schofield | 6,535,987 B1 | 3/2003 | Ferrant |
| 6,163,289 | A | 12/2000 | Ginetti | 6,539,072 B1 | 3/2003 | Donnelly et al. |
| 6,163,579 | A | 12/2000 | Harrington et al. | 6,556,677 B1 | 4/2003 | Hardy |
| 6,166,572 | A | 12/2000 | Yamaoka | 6,563,870 B1 | 5/2003 | Schenk |
| 6,172,634 | B1 | 1/2001 | Leonowich et al. | 6,570,931 B1 | 5/2003 | Song |
| 6,173,019 | B1 | 1/2001 | Hee et al. | 6,563,742 B1 | 6/2003 | Suzuki |
| 6,177,896 | B1 | 1/2001 | Min | 6,576,746 B2 | 6/2003 | McBride et al. |
| 6,185,263 | B1 | 2/2001 | Chan | 6,577,114 B1 | 6/2003 | Roo |
| 6,188,282 | B1 | 2/2001 | Montalvo | 6,583,742 B1 | 6/2003 | Hossack |
| 6,191,719 | B1 | 2/2001 | Bult et al. | 6,590,456 B2 * | 7/2003 | Yang ..................... 330/311 |
| 6,192,226 | B1 | 2/2001 | Fang | 6,594,304 B2 | 7/2003 | Chan |
| 6,201,490 | B1 | 3/2001 | Kawano et al. | 6,606,489 B2 | 8/2003 | Razavi et al. |
| 6,201,831 | B1 | 3/2001 | Agazzi et al. | 6,608,743 B1 | 8/2003 | Suzuki |
| 6,201,841 | B1 | 3/2001 | Iwamatsu et al. | 6,633,178 B2 | 10/2003 | Wilcox et al. |
| 6,204,788 | B1 | 3/2001 | Tani | 6,687,286 B1 | 2/2004 | Leonowich et al. |
| 6,211,716 | B1 | 4/2001 | Nguyen et al. | 6,690,742 B2 | 2/2004 | Chan |
| 6,215,429 | B1 | 4/2001 | Fischer et al. | 6,714,825 B2 | 3/2004 | Tanaka |
| 6,223,061 | B1 | 4/2001 | Dacus et al. | 6,721,379 B1 | 4/2004 | Cranford, Jr. et al. |
| 6,236,345 | B1 | 5/2001 | Dagnachew et al. | 6,731,748 B1 | 5/2004 | Edgar, III et al. |
| 6,236,346 | B1 | 5/2001 | Schofield et al. | 6,744,831 B2 | 6/2004 | Chan |
| 6,236,645 | B1 | 5/2001 | Agazzi | 6,744,931 B2 | 6/2004 | Komiya et al. |
| 6,249,164 | B1 | 6/2001 | Cranford, Jr. et al. | 6,751,202 B1 | 6/2004 | Henrie |
| 6,249,249 | B1 | 6/2001 | Obayashi et al. | 6,765,931 B1 | 7/2004 | Rabenko et al. |
| 6,259,680 | B1 | 6/2001 | Blackwell et al. | 6,775,529 B1 | 8/2004 | Roo |
| 6,259,745 | B1 | 7/2001 | Chan | 6,816,097 B2 | 11/2004 | Brooks et al. |
| 6,259,957 | B1 | 7/2001 | Alexander et al. | 6,823,028 B1 | 11/2004 | Phanse |
| 6,266,367 | B1 | 7/2001 | Strait | 6,844,837 B1 | 1/2005 | Sutardja et al. |
| 6,271,782 | B1 | 8/2001 | Steensgaard-Madsen | 6,864,726 B2 | 3/2005 | Levin et al. |
| 6,275,098 | B1 | 8/2001 | Uehara et al. | 6,882,216 B2 | 4/2005 | Kang |
| 6,259,012 | B1 | 9/2001 | Greig | 6,980,644 B1 | 12/2005 | Sallaway et al. |
| 6,289,068 | B1 | 9/2001 | Hassoun et al. | 2001/0050585 A1 | 12/2001 | Carr |
| 6,295,012 | B1 | 9/2001 | Greig | 2002/0009057 A1 | 1/2002 | Blackwell et al. |
| 6,298,046 | B1 | 10/2001 | Thiele | 2002/0061087 A1 | 5/2002 | Williams |
| 6,309,077 | B1 | 10/2001 | Saif et al. | 2002/0084857 A1 | 7/2002 | Kim |
| 6,288,604 | B1 | 11/2001 | Shih et al. | 2002/0136321 A1 | 9/2002 | Chan |
| 6,307,490 | B1 | 11/2001 | Litfin et al. | 2002/0181601 A1 | 12/2002 | Huang et al. |
| 6,313,775 | B1 | 11/2001 | Lindfors et al. | 2003/0002570 A1 | 1/2003 | Chan |
| 6,332,004 | B1 | 12/2001 | Chan | 2003/0174660 A1 | 9/2003 | Blon et al. |
| 6,333,959 | B1 | 12/2001 | Lai et al. | 2004/0005015 A1 | 1/2004 | Chan |
| 6,339,390 | B1 | 1/2002 | Velazquez et al. | 2004/0090981 A1 | 5/2004 | Lin et al. |
| 6,340,940 | B1 | 1/2002 | Melanson | 2004/0091071 A1 | 5/2004 | Lin et al. |
| 6,342,816 B1 * | | 1/2002 | Gradzki ..................... 330/311 | 2004/0105504 A1 | 6/2004 | Chan |
| 6,346,899 | B1 | 2/2002 | Hadidi | 2004/0141569 A1 | 7/2004 | Agazzi |
| 6,351,229 | B1 | 2/2002 | Wang | 2004/0208312 A1 | 10/2004 | Okuda |
| RE37,619 | E | 4/2002 | Mercer et al. | 2005/0025266 A1 | 2/2005 | Chan |
| 6,369,734 | B2 | 4/2002 | Volk | | | |
| 6,370,190 | B1 | 4/2002 | Young et al. | | | |
| 6,373,417 | B1 | 4/2002 | Melanson | | | |
| 6,373,908 | B2 | 4/2002 | Chan | | | |
| 6,377,640 | B2 | 4/2002 | Trans | | | |
| 6,377,683 | B1 | 4/2002 | Dobson et al. | | | |
| 6,385,238 | B1 | 5/2002 | Nguyen | | | |
| 6,385,442 | B1 | 5/2002 | Vu et al. | | | |

FOREIGN PATENT DOCUMENTS

| | | |
|---|---|---|
| EP | 0800 278 | 8/1997 |
| EP | WO 99/46867 | 9/1999 |
| EP | WO 00/27079 | 5/2000 |
| EP | WO 00/28663 A2 | 5/2000 |
| EP | WO 00/28663 A3 | 5/2000 |

| | | |
|---|---|---|
| EP | WO 00/28691 | 5/2000 |
| EP | WO 00/28691 A2 | 5/2000 |
| EP | WO 00/28691 A3 | 5/2000 |
| EP | WO 00/35094 | 6/2000 |
| JP | 57-48827 | 3/1982 |
| JP | 58-111415 | 7/1983 |
| JP | 62-159925 | 7/1987 |
| JP | 63-300700 | 7/1988 |
| JP | 204527 | 8/1989 |
| JP | 3-273704 | 12/1991 |
| JP | 4-293306 | 10/1992 |
| JP | 4-351109 | 12/1992 |
| JP | 05-064231 | 3/1993 |
| JP | 06-029853 | 2/1994 |
| JP | 06-98731 | 4/1994 |
| JP | 6-276182 | 9/1994 |
| JP | 7-131260 | 5/1995 |
| JP | 09-55770 | 8/1995 |
| JP | 09-270707 | 3/1996 |
| JP | 10-126183 | 5/1998 |
| JP | 2001-177409 | 12/1999 |
| JP | 06-97831 | 4/2005 |
| JP | 09-270707 | 4/2005 |
| JP | 2001-177409 | 4/2005 |
| TW | 0497334 | 8/2002 |
| TW | 0512608 | 12/2002 |
| TW | 0545016 | 8/2003 |
| WO | WO 00/28668 | 5/2000 |
| WO | WO 00/28712 | 5/2000 |

OTHER PUBLICATIONS

U.S. Appl. No. 09/737,743, dated Dec. 2000, Sutardja.
U.S. Appl. No. 09/920,240, dated Aug. 2001, Roo et al.
U.S. Appl. No. 09/920,241, dated Aug. 2001, Roo.
U.S. Appl. No. 60/106,265, filed Oct. 1998, Chan.
U.S. Appl. No. 60/107,105, filed Nov. 1998, Chan.
U.S. Appl. No. 60/107,702, filed Nov. 1998, Chan.
U.S. Appl. No. 60/108,001, filed Nov. 1998, Chan.
Abidi et al; "FA 7.2: The Future of CMOS Wireless Transceivers"; Feb. 7, 1997, pp. 118-119, 440.
Abidi, "TP 11.1: Direct-Conversion Radio Transceivers for Digital Communications" 1995.
American National Standard, "Fibre Distributed Data interface (FDDI) - Token Ring Twisted Pair Layer Medium Dependent (TP-PMD)", Sep. 25, 1995.
Azadet et al; "A Gigabit Transceiver Chip Set for UTP CA-6 Cables in Digital CMOS Technology"; Feb. 2000.
Azadet, Kamran Nicole, Chris; "Low-Power Equalizer Architectures for High-Speed Modems"; Oct. 1998; pp. 118-126.
Baird et al; "A Mixed Sample 120M s PRML Solution for DVD Systems", 1999.
Baker, "An Adaptive Cable Equalizer for Serial Digital Rates to 400Mb/s", 1996.
Banu et al; "A BiCMOS Double-Low-IF Receiver for GSM", 1997, pp. 521-524.
Bertolaccini, Mario et al; "A Precision Baseline Offset and Drift Corrector for Low-Frequency Applications", IEEE Transactions on Instrumentation and Measurement, vol. IM-34, No. 3, Sep. 1985, pp. 405-412.
Chan et al; A 100 Mb/s CMOS 100Base-T4 Fast Ethernet Transceiver for Catagory 3, 4 and 5 UTP, 1998.
Chang et al; "A CMOS Channel-Select Filter for a Direct-Conversion Wireless Receiver", 1996, pp. 62-63.
Chang et al; Large Suspended Inductors on Silicon and Their Use in a 1-μm CMOS RF Amplifier, May 1993, pp. 246-248.
Chien et al; "TP 12.4: A 900-MHz Local Oscillator using a DLL-based Frequency Multiplier Technique for PCS Applications"; Feb. 8, 2000; 3 pages.
Chien, "Delay Based Monolithic CMOS Frequency Synthesizer for Portable Wireless Applications", May 20, 1998.
Chien, "Low-Noise Local Oscillator Design Techniques using DLL-based Frequency Multiplier for Wireless Applications", 2000.
Chien, "Monolithic CMOS Frequency Synthesizer for Cellular Applications", Mar. 12-13, 1997; 9 pages.
Chin et al; "A 10-b 125 MHz CMOS digital-to-analog (DAC) with threshold-voltage compensated current sources", Nov. 1994, pp. 1374-1380.
Cho et al; "A Single-Chip CMOS Direct Conversion Transceiver for 900 MHz Spread-Spectrum Digital Cordless Telephones"; 1999, pp. 228-229, 464.
Craninckx et al; "A 1.8-GHz Low-Phase-Noise CMOS VCO Using Optimized Hollow Spiral Inductors"; 1997, pp. 736-744.
Craninckx et al; "A 1.8-GHz Low-Phase-Noise Voltage-Controlled Oscillator with Prescaler"; 1995, pp. 1474-1482.
Dally et al; "Digital Systems Engineering", cover and pp., Jun. 1998 390-391.
Dally et al; "High Performance Electrical Signaling"; Jun. 1998; 6 pages.
Dauphinee et al; "SP 23.7: A Balanced 1.5 GHz Voltage Controlled Oscillator with an Integrated LC Resonator", 1997, pp. 390-391, 491.
Davies; "Digital Generation of Low-Frequency Sine Waves", Jun. 1969, pp. 97-105.
Dec et al; "MP 4.8: A 1.9 GHz Micromachine-Based Low-Phase-Noise CMOS VCO"; 1999, pp. 80-81, 449.
Dehng et al; "A Fast-Lock Mixed-Mode DLL Using a 2-b SAR Algorithm"; Oct. 2001; pp. 1464-1471.
Dehng et al; "Clock-Deskaw Buffer Using a SAR-Controlled Delay-Locked Loop"; Aug. 2000; pp. 1128-1136.
Dolle, "A Dynamic Line-Termiantion Circuit for Multireceiver Nets", Dec. 1993, pp. 1370-1373.
DP83220 CDL "Twisted Pair FDDI Transceiver Device", Oct. 1992.
Dunning, Jim, "An All-Digital Phase-Locked Loop with 50-Cycle Lock Time Suitable for High-Performance Microprocessors", IEEE Journal of Solid-State Circuits, vol. 30, No. 4, Apr. 1995, pp. 412-422.
Efendovich et al; "Multifrequency Zero-Jitter Delay-Locked Loop", Jan. 1994, 67-70.
Eto et al; "A 333 MHz, 20mW, 18ps Resolution Digital DLL using Current-controlled Delay with Parallel Variables Resistor DAC (PVR-DAC)"; Aug. 28-30, 2000, pp. 349-350.
Everitt et al; "A 10/100Mb/s CMOS Ethernet Transceiver for 10BaseT, 10BaseTX and 100BaseFX", 1998.
Everitt, James et al; "A CMOS Transceiver for 10-Mb/s and 100-Mb/s Ethernet", IEEE Journal of Solid-State Circuits, vol. 33, No. 12, Dec. 1998, pp. 2169-2177.
Farjad-rad, et al; "4.5 A 0.2-2GHz 12mW Multiplying DLL for Low-Jitter Clock Synthesis in Highly Integrated Data Communication Chip"; 2002; 8 pages.
Fournier et al; "A 130-MHz 8-b CMOS video DAC for HDTV applications"; Jul. 1991, pp. 1073-1077.
Fuad Surial Atiya et al; "An Operational Amplifier Circulator Based on the Weighted Summer", Jun. 1975.
Gabara; "On-Chip Terminating Registers for High Speed ECL-CMOS Interfaces", 1992, pp. 292-295.
Gardner, "Charge-Pump Phase-Lock Loops", Nov. 1980, pp. 1849-1858.
Garlepp et al; "A Portable Digital DLL Architecture for CMOS Interface Circuits", 1998 Symposium on VLSI Circuits Digest of Technical Papers, pp. 214-215.
Gharpurey et al; Modeling and Analysis of Substrate Coupling in Integrated Circuits, Mar. 1996, pp. 344-353.
Gigabit Ethernet Alliance; "Gigabit Ethernet 1000Base-T", copyright 1997.
Goldberg, Lee; "Gigabit Ethernet PHY Chip Sets LAN Speed Record for CopperStory", Tech Insights, Nov. 16, 1998; 6 pages.
Gotoh et al; "All-Digital Multi-Phase Delay Locked Loop for Internal Timing Generation in Embedded and/or High-Speed DRAMS"; pp. 107-108.
Gray et al, "Analysis and Design of Analog Integrated Circuits", Fourth Edition, Jun. 2005; pp. 217-221.
Gray et al; "Analysis and Design of Analog Integrated Circuits", 1993; pp. 270 and 274.

Gray et al; "Future Directions in Silicon ICs for RF Personal Communications", 1995, pp. 83-90.

H4000 Digital Ethernet Transceiver Technical Manual, Distributed Systems, Chapter 3, pp. 3-1 to 3-11, copyright 1982 by Digital Equipment Corporation.

Hajimiri et al; "Phase Noise in Multi-Gigahertz CMOS Ring Oscillators", 1998, 49-52.

Hamasaki et al; "A 3-V, 22-mV Multibit Current Mode EΔ DAC with 100dB Dynamic Range"; Dec. 1996, pp. 1888-1894.

Harald et al; "Design of a 10-bit 100 MSamples/s BiCMOS D/A Converter", 1996, pp. 730-733.

He et al; "A DSP Receiver for 1000 Base-T PHY", 2001.

Hellums et al; "An ADSL Integrated Active Hybrid Circuit"; Solid States Circuits Conference; Sep. 2003; 23 pages.

Hellwarth et al; "Digital-to-analog Converter having Common-mode Isolation and Differential Output"; Jul. 1972; pp. 54-60.

Henriques et al; "A CMOS Steering-Current Multiplying Digital-to-Analog Converter"; 1995, pp. 145-155.

Hester et al; "CODEC for Echo-Canceling Full-Rate ADSL Modems"; Dec. 1999.

Horowitz et al; "High-Speed Electrical Signaling: Overview and Limitations", 1998, pp. 12-24.

Hu et al; "A Monolithic 480 Mb/s Parallel AGC/Decision/Clock-Recovery Circuit in 1.2-μm CMOS"; Dec. 1993, pp. 1314-1320.

Hung et al; "A 1.24-GHz Monolithic CMOS VCO with Phase Noise of 137 dBc/Hz at a 3-MHz Offset"; 1999, pp. 111-113.

Intersil, HC-5509B ITU CO/Loop Carrier SLIC, Aug. 2003.

Jansen et al; SP 23.8: Silicon Bipolar VCO Family for 1.1 to 2.2 GHz with Fully-Integrated Tank and Tuning Circuits, Feb. 8, 1997, 392-393, 492.

Johns et al; "Integrated Circuits for Data Transmission Over Twisted Pair Channels", Mar. 1997, pp. 398-406.

Johnson et al; "THAM 11.2: A Variable Delay Line Phase Locked Loop for CPU-Coprocessor Synchronization"; Feb. 18, 1988; 4 pages.

Kelly, N. Patrick et al; "WA 18.5 - A Mixed-Signal DFE/FFE Receiver for 100Base-TX Applications", ISSCC 2000/Session 18/Wireline Communications/Paper WA 18.5, 2000 IEEE International Solid-State Circuits Conference, pp. 310-311.

Kim et al; "A 30-MHz Hybrid Analog/Digital Clock Recovery Circuit in 2-um CMOS", 1990, pp. 1385-1394.

Kim et al; "A Low-Power Small-Area 7.28-ps-Jitter 1-GHz DLL-Based Clock Generator"; Nov. 2002; pp. 1414-1420.

Kim et al; "PLL/DLL System Noise Analysis for Low Jitter Clock Synthesizer Design"; ISCAS 1994; pp. 31-34.

Kinget, FP 14.7: A Fully Integrated 2.7V 0.35μm CMOS VCO for GHz Wireless Applications, Feb. 5, 1998.

Knight, Jr. et al; A Self-Terminating Low-Voltage Swing CMOS Output Driver, 1988, 457-464.

Koullias et al; "TP 9.2: A 900 MHz Transceiver Chip Set for Dual-Mode Cellular Radio Mobile Terminals", 1993, pp. 140-141, 278.

Lam et al; "WP 23.6: A 2.6 GHz/5.2 GHz CMOS Voltage-Controlled Oscillator", 1999, pp. 402-403, 484.

Lee et al; "A 2.5 V CMOS Delay-Locked Loop for an 18 Mbit, 500 Megabytes/s DRAM"; 1994, pp. 1491-1496.

Lee et al; "A 3V 10b 100 MS/s Digital-to-Analog Converter for Cable Modem Applications", Aug. 28-30, 2000; pp. 203-205.

Lee et al; "A CMOS Serial Link for Fully Duplexed Data Communication", Apr. 1995.

Lee et al; "A Fully Integrated Low-Noise 1-GHz Frequency Synthesizer Design for Mobile Communication Application"; May 1997, pp. 760-765.

Letham et al; "A high-performance CMOS 70-Mhzpalette/DAC", Dec. 1987, pp. 1041-1047.

Liberali et al; "Progress in High-Speed and High-Resolution CMOS Data Converters", Sep. 12-14, 1995, pp. 19-28.

Lin et al; "A 10-b, 500-Msample/s CMOS DAC in 0.6mm2"; Dec. 1996; pp. 1948-1958.

Lin et al; A Register-Controller Symmetrical DLL for Double-Data-Rate DRAM; Apr. 1999; pp. 565-568.

Lin et al; "TP 12.5: A 1.4 GHz Differential Low-Noise CMOS Frequency Synthesizer using a Wideband PLL Architecture"; 2000, pp. 204-205, 458.

Linear Technology, "High Speed Modem Solutions", InfoCard 20, Linear Technology Corporation; Mar. 12-13, 1997; 6 pages.

Liu et al; "WP 23.7: A 6.5 GHz Monolithic CMOS Voltage-Controlled Oscillator", 1999, pp. 404-405, 484.

Maneatis, John G., FA 8.1: Low-Jitter Process-Independent DLL and PLL Based on Self-Biased Techniques, Nov. 1996, 1723-1732.

Mano, "Digital Logic and Computer Design"; 1979; 627 pages.

Marshall et al; "TA 8.7: A 2.7V GSM Transceiver ICs with On-Chip Filtering", 1995.

Miki et al; "An 80-MHz 8-bit CMOS D/A Converter", Dec. 1986, pp. 983-988.

Millman et al; "Pulse, Digital, and Switching Waveforms"; 1965; pp. 674-675.

Moon, Yongsam et al; "An All-Analog Multiphase Delay-Locked Loop Using a Replica Delay Line for Wide-Range Operation and Low-Jitter Performance", IEEE Journal of Solid-State Circuits, vol. 35, No. 3, Mar. 2000, pp. 377-384.

Mueller, K.H.; "Combining Echo Cancellation and Decision Feedback Equalization", The Bell System Technical Journal, vol. 58, No. 2, Feb. 1979, pp. 491-500.

Munshi et al; "Adaptive Impedance Matching"; ISCAS 1994; pp. 69-72.

Myson Technology; "MTD214 - Ethernet Encoder/Decoder and 10BaseT Transceiver with Built-in Waveform Shaper"; 1997, pp. 1-11.

Myson Technology; "MTD972 (Preliminary) 100BaseTX PCS/PMA", 1997, pp. 1-21.

Nack et al; "A Constant Slew Rate Ethernet Line Driver", May 2001.

Nakamura et al; "A 10-b 70-MS/s CMOS D/A/ converter", Apr. 1991, pp. 637-642.

Narayanan et al; "Doppler Estimation Using a Coherent Ultrawide-Band Random Noise Radar", Jun. 2000.

Nguyen et al; "Si IC-Compatible Inductors and LC Passive Filters", Aug. 1990, pp. 1028-1031.

Niknejad et al; "Analysis and Optimization of Monolithic Inductors and Transformers for RF ICs", 1997, pp. 375-378.

Niknejad et al; "Analysis, Design, and Optimization of Spiral Inductors and Transformers for Si RF IS's", Oct. 1998, pp. 1470-1481.

Niknejad et al; Numerically Stable Green Function for Modeling and Analysis of Substrate Coupling in Integrated Circuits, Apr. 1998, 305-315.

Parameswaran et al; "A New Approach for the Fabrication of Micromechanical Structures", Dec. 6, 1998, pp. 289-307.

Park et al; "A Low-Noise, 900 MHz VCO in 0.6μm CMOS"; May 1999, pp. 586-591.

Parker et al; "A Low-Noise 1.6-GHz CMOS PLL with On-Chip Loop Filter"; 1997, pp. 407, 409-410.

Phillips, The HC-5502X14X Telephone Subscriber Line Interface Circuits (SLIC), Jan. 1997.

Radke et al; "A 14-Bit Current-Mode EΔ DAC Based Upon Rotated Data Weighted Averaging"; Aug. 2000, pp. 1074-1084.

Rao, Sailesh; Short Course: Local Area Networks, International Solid State Circuits Conference; Sailesh Rao; Outline Implementing Gigabit Ethernet Over Cat-5 Twisted-Pair Cabling; Jack Kenny; Signal Processing and Detection in Gigabit Ethernet; Feb. 1999; 3 pages.

Razavi; "Principles of Data Conversion System Design"; 1995; 139 pages.

Razavi; "SP 23.6: A 1.8 GHz CMOS Voltage-Controlled Oscillator"; 1997, pp. 388-389.

Regan, "ADSL Line Driver/Receiver Design Guide", Part 1, Feb. 2000.

Reynolds, "A 320 MHz CMOS triple 8b DAC with on-chip PLL and hardware cursor", Feb. 1994, pp. 50-51.

Rofougaran et al; "SP 24.6: A 900 MHz CMOS LC-Oscillator with Quadrature Outputs", 1996.

Roo et al; "A CMOS Transceiver Analog Front-end for Gigabit Ethernet over Cat-5 Cables", 2001.

Rudell et al; "A 1.9-GHz Wide-Band IF Double Conversion CMOS Receiver for Cordless Telephone Applications", 1997, pp. 2071-2088.

Rudell et al; Recent Developments in High Integration Multi-Standard CMOS Transceivers for Personal Communications Systems, 1998, 149-154.

Rudell et al; "SA 18.3: A 1.9 GHz Wide-band IF Double Conversion CMOS Integrated Receiver for Cordless Telephone Applications", 1997, pp. 304-305, 476.

Sato et al; "SP 21.2: A 1.9 GHz Single-Chip IF Transceiver for Digital Cordless Phones", Feb. 10, 1996.

Sendra et al; "Micro-Electronic Circuits", 1982, pp. 95-97 and 243-247.

Sendra et al; "Microelectronics Circuits", Third Edition, 1991, pp. 48-115.

Sendra et al; "Microelectronics Circuits", Third Edition, Chapter 2: Operational Amplifiers, Section 2.4; pp. 61-63, 1991.

Shoael et al; "A 3V Low Power 0.25μm CMOS 100Mb/s Receiver for Fast Ethernet", 2000.

Shoval et al; A 100 Mb/s BiCMOS Adaptive Pulse-Shaping Filter, Dec. 1995, 1692-1702.

Shoval et al; "A CMOS MIxed-Signal 100Mb/s Receive Architecture for Fast Ethernet ", 1999.

Shoval et al; "WA 18.7 - A Combined 10/125 Mbaud Twisted-Pair Line Driver with Programmable Performance/Power Features," 2000, pp. 314-315.

Shui et al; "Mismatch Shaping for a Current-Mode Multibit Delta-Sigma DAC", Mar. 1999; pp. 331-338.

Song et al; "FP 12.1: NRZ Timing Recovery Technique for Band-Limited Channels" (Slide Supplement), 1996.

Song, "Dual Mode Transmitter with Adaptively Controlled Slew Rate and Impedance Supporting Wide Range Data Rates," 2001.

Song, Bang-Sup et al; "FP 12.1: NRZ Timing Recovery Technique for Band-Limited Channels", ISSCC 96/Session 12/Serial Data Communications/Paper FP 12.1, 1996 IEEE International Solid State Conference, pp. 194-196.

Sonntag et al; "FAM: 11.5: A Monolithic CMOS 10MHz DPLL for Burse-Mode"; Feb. 1999: pp. 194-195, 294.

Soyuer et al; "A Monolithic 2.3-Gb/s 100-mW Clock and Data Recovery Circuit in Silicon Bipolar Technology", Dec. 1993, pp. 1310-1313.

Stephens, "Active Output Impedance for ADLS Line Drivers", Nov. 2002.

Stonick et al; An Adaptive PAM-4 5-Gb/s Backplane Transceiver in 0.25-um CMOS; IEEE Journal of Solid-State Circuits, vol. 38, No. 3, Mar. 2003; pp. 436-443.

Su et al; "A CMOS OVersampling D/A Converter with a Current-Mode Semidigital Reconstruction Filter", Dec. 1993, pp. 1224-1233.

Su et al; "Experimental Results and Modeling Techniques for Substrate Noise in Mixed-Signal Integrated Circuits", Apr. 1993, pp. 420-430.

Takakura et al; "A 10 bit 80 MHz glitchless CMOS D/A/ converter", May 1991, pp. 26.5.1-26.5.4.

Tham, Joo Leong et al; "A 2.7-V 900 MHz/1.9-GHz Dual-Band Transceiver IC for Digital Wireless Communication", 1999, pp. 286-291.

The Authoritative Dictionary of IEEE Standards Sterns 7th Edition; Jan. 2006; p. 280.

The Electrical Engineering Handbook, Chapter 31, "D/A and A/D Converters", Richard C. Dorf, editor, CRC Press, 1993.

Tsutomu Kamoto; "An 8-bit 2-ns Monolithic DAC", Feb. 1988.

Uda et al; "125Mbit/s Fiber Optic Transmitter/Receiver with Duplex Connector", Fiber Optic Communications Development Div., NEC Corporation, NEC Engineering, Ltd. and English Language Translation; 1988; 12 pages.

Van de Plassche; "Integrated Analog-to-Digital and Digital-to-Analog Converters - Chapter 6"; Dec. 1999; pp. 211-271.

Van der Plas et al; "A 14-Bit Intrinsic Accuracy Q2 Random Walk CMOS DAC", Dec. 1999, pp. 1708-1718.

Waizman; "FA 18.5: A Delay Line Loop for Frequency Synthesis of De-Skewed Clock"; Feb. 18, 1994, pp. 298-299.

Walker et al; A Two Chip 1.5 GBd Serial Link Interface, Dec. 1992.

Wang et al; A 1.2 GHz programmable DLL-Based Frequency Multiplier for Wireless Applications; Dec. 2004.

Wang et al; "WP 23.8: A 9.8 GHz Back-Gate Tuned VCO in 0.35 um CMOS", 1999, pp. 406-407, 484.

Wang, HongMol; "WP 23.8: A 9.8 GHz Back-Gate Tuned VCO in 0.35μm CMOS", ISSCC99, Session 23, Paper WP 23.8 1999 IEEE International Solid-State Circuits Conference, pp. 406-407, 484.

Weaver, Jr.; "A Third Method of Generation and Detection of Single-Sideband Signals", Dec. 1956, pp. 1703-1705.

Weigandt et al; "Analysis of Timing Jitters in CMOS Ring Oscillators"; ISCAS 1994; pp. 27-30.

Wikner et al; "Modeling of CMOS Digital-to Analog Converters for Telecommunication"; May 1999, pp. 489-499.

Wu et al; "A low glitch 10-bit 75 MHz CMOS video D/A converter", Jan. 1995, pp. 68-72.

Yamaguchi et al; "400Mbit/s Submarine Optical Repeater Using Integrated Circuits", Fujitsu Laboratories Ltd. and English Language Translation; 1988; 16 pages.

Yee et al; "An Integratable 1-2.5 Gbps Low Jitter CMOS Transceiver with Built in Self Test Capability", 1999.

Young et al; "A Low-Noise RF Voltage-Controlled Oscillator Using On-Chip High-Q Three-Dimensional Coil Inductor and Micromachined Variable Capacitor"; Jun. 8-11, 1998, pp. 128-131.

Young et al; "A Micromachined Variable Capacitor for Monolithic Low-Noise VCOS"; 1996, pp. 86-89.

Young et al; "Monolithic High-Performance three-Dimensional Coil Inductors for Wireless Communications", 1997.

IEEE Standards 802.3: Part 3 Carrier Sense Multiple Access with Collision Detection (CSMA/CD) Access Method and Physical Detection; Mar. 8, 2002; pp. 1-1538.

* cited by examiner

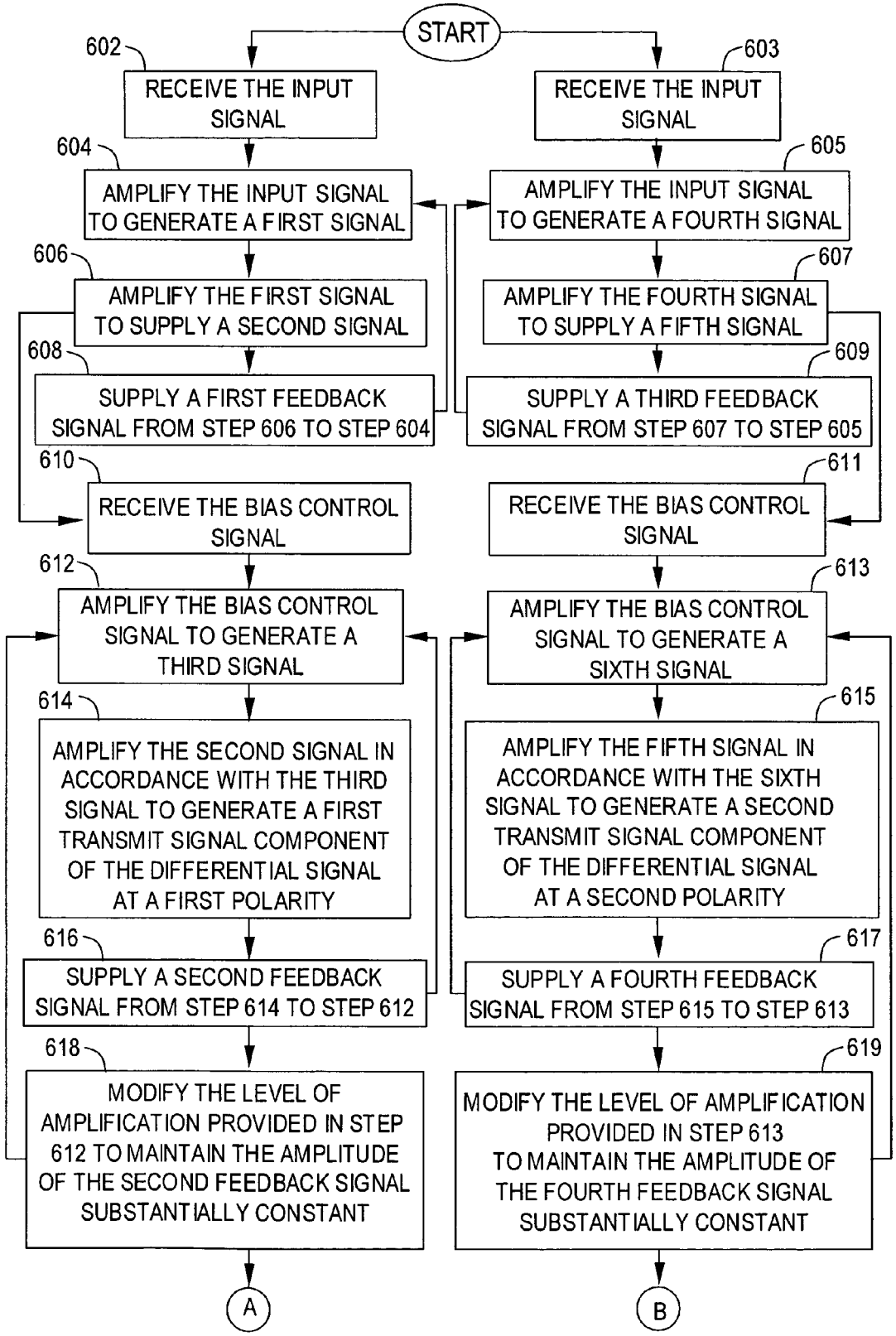

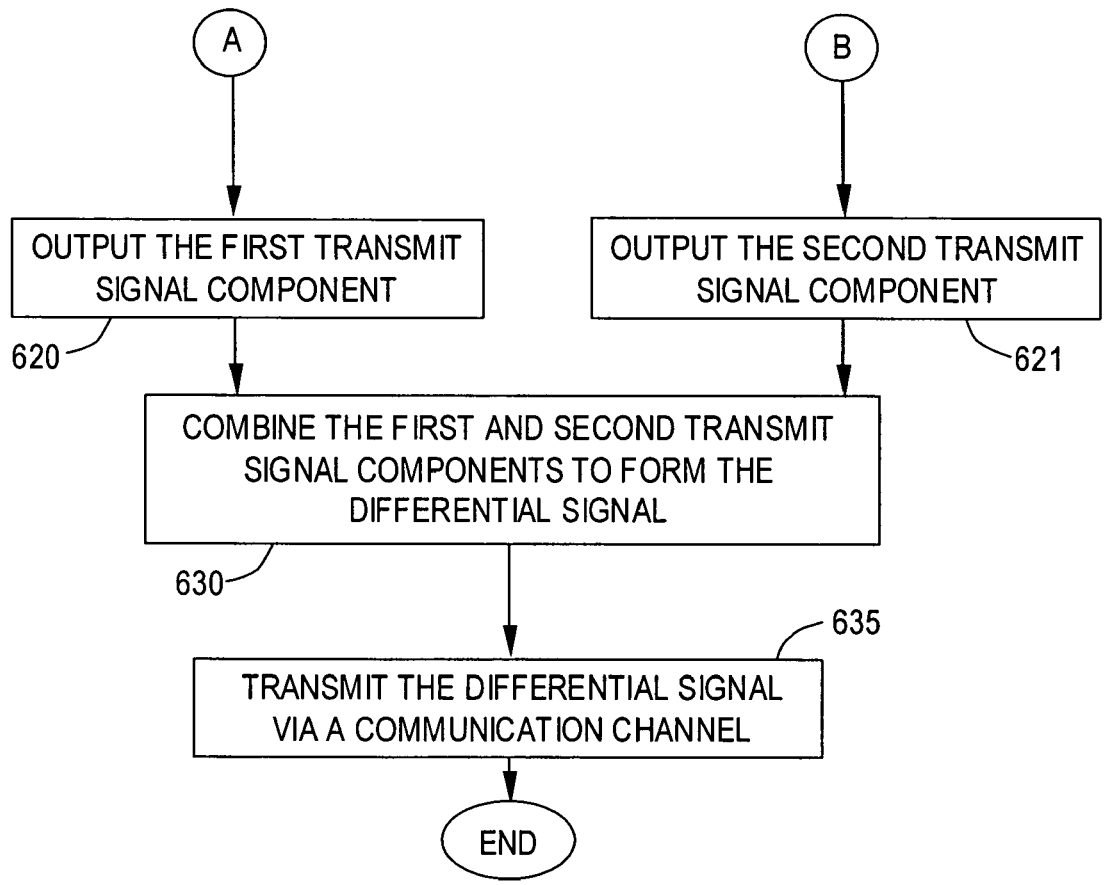

CASCODE GAIN BOOSTING SYSTEM AND METHOD FOR A TRANSMITTER

BACKGROUND

This application claims priority under 35 U.S.C. § 119(e) to U.S. Provisional Application No. 60/706,421, filed on Aug. 9, 2005, the entire contents of which are hereby incorporated by reference herein.

1. Field of the Invention

The present invention relates to systems for communicating data via a communication channel. More particularly, the present invention relates to a cascode gain boosting system and method that can be used in a transmitter, such as, for example, a gigabit transmitter or the like.

2. Background Information

For purposes of illustration, FIG. 1 is a diagram illustrating a transmission system 100 that can be used to transmit, for example, a differential output current signal $I_{OUT}$. In differential mode, $I_{OUT} = I_{OUT+} - I_{OUT-}$. In the differential configuration, the transmission system 100 includes a driver circuit 103 for a first polarity signal configured to generate the positive component signal (e.g., $I_{OUT+}$) of the differential output current signal. A driver circuit 107 for a second polarity signal is configured to generate the negative component signal (e.g., $I_{OUT-}$) of the differential output current signal. The driver circuit 103 for the first polarity signal and the driver circuit 107 for the second polarity signal are respectively coupled to an interface circuit 150 for interfacing the driver circuits to unshielded twisted pairs (hereinafter "UTP") 155 (e.g., Category-5 twisted pair cables for a gigabit channel or the like). The interface circuit 150 can include one or more resistors $R_{TX}$. The resistor $R_{TX}$ is arranged in parallel across the primary windings of an isolation transformer 165, with the secondary windings coupled to the UTP 155. The isolation transformer 165 includes a center tap on the primary windings with a DC center tap voltage, $V_{CT}$ 170.

The driver circuit 103 for the first polarity signal includes a pair of transistors (e.g., first transistor $Q_1$ and second transistor $Q_2$) arranged in a cascode configuration. In such a cascode circuit, the first transistor $Q_1$ is arranged in a common-source (or common-emitter) configuration, and is followed by the second transistor $Q_2$ arranged in a common-gate (or common-base) configuration that is biased by a (constant) bias voltage, such as, for example, bias signal $V_{BIAS}$. The bias signal $V_{BIAS}$ can be operated at a value determined by, for example, the saturation condition of the transistors at the maximum output current.

More particularly, the first transistor $Q_1$ includes a gate electrode configured to receive an input signal $V_{INPUT}$, and a source electrode coupled to a reference voltage 130 (e.g., a ground) through a load (e.g., source resistor $R_{S+}$). The second transistor $Q_2$ includes a gate electrode configured to receive the bias signal $V_{BIAS}$, and a source electrode coupled to the drain electrode of the first transistor $Q_1$. The positive component signal of the differential output current signal (e.g., $I_{OUT+}$) is output on the drain electrode of the second transistor $Q_2$, which is coupled to the interface circuit 150. For purposes of illustration, denote the gain of the first transistor $Q_1$ as $A_1$, and the gain of the second transistor $Q_2$ as $A_2$. Consequently, the output impedance $R_{O+}$ of the driver circuit 103 for the first polarity signal (i.e., the output impedance looking "down" into the driver circuit 103 for the first polarity signal) is given as: $R_{O+}=(A_1)(A_2)R_{S+}$. The driver circuit 107 for the second polarity signal comprises a similar configuration and operation to that of the driver circuit 103 for the first polarity signal to output the negative component signal of the differential output current signal (e.g., $I_{OUT-}$).

With respect to the driver circuit 103 for the first polarity signal, the input signal $V_{INPUT}$ is applied to the gate electrode of the first transistor $Q_1$, and the bias signal $V_{BIAS}$ is applied to the gate electrode of the second transistor $Q_2$. The first transistor $Q_1$ converts the input signal $V_{INPUT}$ into a proportional current, which produces potential variations on the source electrode of the second transistor $Q_2$. These variations appear on the output of the driver circuit 103 for the first polarity signal, amplified by the gain factor of the first and second transistors $Q_1$ and $Q_2$. The cascode configuration can operate, for example, to keep the current at node 140 (located between the drain electrode of the first transistor $Q_1$ and the source electrode of the second transistor $Q_2$) substantially constant so that there is little signal sweep, and, therefore, little change in the current output by the first transistor $Q_1$. However, in the presence of very large swings of the output signals, lowering the center tap voltage $V_{CT}$ 170 can move the cascode circuit closer to its swing point. For purposes of illustration, let $V_{CT}=1.8$ V. For 10 BASE-T operation, $V_{TX+}=V_{CT}\pm1.25$ V. Thus, the output voltage ($V_{TX+}$) of the driver circuit 103 for the first polarity signal can swing from 0.55 V to 3.05 V. However, the lower swing voltage of 0.55V can result in the "quashing" of the second transistor $Q_2$ and pushing the first transistor $Q_1$ into saturation and out of its corresponding linear operating range.

Therefore, there is a need for an improved transmitter design to allow transmission systems, such as, for example, transmission system 100, to operate at very low center tap voltages.

SUMMARY OF THE INVENTION

A cascode gain boosting system and method is disclosed that can be used with, for example, gigabit Ethernet and the like. In accordance with exemplary embodiments of the present invention, according to a first aspect of the present invention, a communication device includes a first polarity driver circuit. The first polarity driver circuit includes a first current source and a first amplifier. The first amplifier is arranged in a feedback configuration with the first current source. The first amplifier is configured to receive an input signal. The first polarity driver circuit includes a first cascode device. The first cascode device is arranged in a cascode configuration with the first current source. The first polarity driver circuit includes a second amplifier. The second amplifier is arranged in a feedback configuration with the first cascode device. The second amplifier is configured to receive a bias control signal.

According to the first aspect, the first polarity driver circuit can be configured to generate a transmit signal component of a differential signal at a first polarity. The first cascode device can be configured to output the transmit signal component of the differential signal at the first polarity. The input signal can comprise an input voltage signal. The first amplifier and the first current source can be configured to convert the input voltage signal into a corresponding current signal for supply to the first cascode device. The second amplifier can be configured to enhance a gain provided by the first cascode device to increase an output impedance of the first polarity driver circuit. The second amplifier can comprise an amplifier circuit selected from the group consisting of a differential amplifier and a feedback amplifier. The first cascode device can comprise, for example, a transistor. The first current source can comprise, for example, a transistor in communication with a load. The communication device can comprise a bias signal device in communication with the second amplifier. The bias signal device can be configured to generate the bias signal for biasing the first polarity driver circuit. The communication device can comprise a bias signal control device in communication with the bias signal device. The bias signal control device can be configured to control the bias signal circuit to alter the bias signal.

According to the first aspect, the communication device can include a second polarity driver circuit. The second polarity driver circuit can include a second current source and a third amplifier. The third amplifier can be arranged in a feedback configuration with the second current source. The third amplifier can be configured to receive the input signal. The second polarity driver circuit can include a second cascode device. The second cascode device can be arranged in a cascode configuration with the second current source. The second polarity driver circuit can include a fourth amplifier. The fourth amplifier can be arranged in a feedback configuration with the second cascode device. The fourth amplifier can be configured to receive the bias control signal.

According to the first aspect, the second polarity driver circuit can be configured to generate a transmit signal component of the differential signal at a second polarity. The second cascode device can be configured to output the transmit signal component of the differential signal at the second polarity. The third amplifier and the second current source can be configured to convert the input voltage signal into a corresponding current signal for supply to the second cascode device. Each of the second and fourth amplifiers can be configured to enhance a gain provided by the first and second cascode devices, respectively, to increase an output impedance of the first polarity and second polarity driver circuits, respectively. Each of the second and fourth amplifiers can comprise an amplifier circuit selected from the group consisting of a differential amplifier and a feedback amplifier. Each of the first and second cascode devices can comprise, for example, a transistor. Each of the first and second current source can comprise, for example, a transistor in communication with a load.

According to the first aspect, the communication device can include a bias signal device in communication with the second and fourth amplifiers. The bias signal device can be configured to generate the bias signal for biasing the first polarity and second polarity driver circuits. The communication device can include a bias signal control device in communication with the bias signal device. The bias signal control device can be configured to control the bias signal circuit to alter the bias signal. The communication device can include an interface device in communication with the first polarity and second polarity driver circuits. The interface device can be configured to interface the communication device to a communication channel. According to an exemplary embodiment of the first aspect, each of the first and second current sources can comprise a transistor arranged in one of a common-emitter and a common-source configuration. Each of the first and second cascode devices can comprise a transistor arranged in one of a common-base and a common-gate configuration. The first polarity driver circuit and the second polarity driver circuit can be arranged in a differential configuration to output a differential signal.

According to the first aspect, the communication device can include a voltage source. The voltage source can be configured to supply a voltage to the second amplifier. The voltage supplied by the voltage source can be modified to alter the maximum signal output by the first cascode device. According to an alternative exemplary embodiment of the first aspect, the communication device can include first and second voltage sources configured to supply first and second voltages, respectively, to the second and fourth amplifiers, respectively. The first and/or second voltages supplied by the first and second voltage sources, respectively, can be modified to alter the maximum signals output by the first and second cascode devices, respectively. Additionally, the bias signal device can be configured to maintain the linear operation of the first and second cascode devices throughout associated swings in output voltages.

According to the first aspect, the differential signal can comprise a gigabit Ethernet signal or the like. The communication device can be compatible with any suitable wired or wireless standard, such as, for example, 10BASE-T, 100BASE-T, 100BASE-TX, 1000BASE-T or 10GBASE-T. The communication device can be formed on a monolithic substrate. According to an exemplary embodiment of the first aspect, a gigabit transmitter can comprise the communication device. According to an alternative exemplary embodiment of the first aspect, an Ethernet controller can comprise the communication device.

According to a second aspect of the present invention, a method of communicating information includes the steps of: (a) receiving an input signal; (b) amplifying the input signal to generate a first signal; (c) amplifying the first signal from step (b) to supply a second signal; (d) supplying a first feedback signal from step (c) to step (b); (e) receiving a bias control signal; (f) amplifying the bias control signal to generate a third signal; (g) amplifying the second signal supplied from step (c) in accordance with the third signal; and (h) supplying a second feedback signal from step (g) to step (f), wherein step (h) comprises the step of: (h1) modifying a level of amplification provided in step (f) to maintain an amplitude of the second feedback signal substantially constant.

According to the second aspect, step (g) can comprise the step of: (g1) generating a transmit signal component of a differential signal at a first polarity. The method can include the steps of: (i) outputting the transmit signal component of the differential signal at the first polarity. The method can include the steps of: (j) receiving the input signal; (k) amplifying the input signal to generate a fourth signal; (l) amplifying the fourth signal from step (k) to supply a fifth signal; (m) supplying a third feedback signal from step (l) to step (k); (n) receiving the bias control signal; (o) amplifying the bias control signal to generate a sixth signal; (p) amplifying the fifth signal supplied from step (l) in accordance with the sixth signal to generate a transmit signal component of the differential signal at a second polarity; and (q) supplying a fourth feedback signal from step (p) to step (o), wherein step (q) comprises the step of: (q1) modifying a level of amplification provided in step (o) to maintain an amplitude of the fourth feedback signal substantially constant. The method can also include the step of: (r) outputting the transmit signal component of the differential signal at the second polarity.

According to the second aspect, the method can include the steps of: (s) supplying a voltage signal to step (f); and (t) modifying the voltage signal supplied by step (s) to alter a maximum signal output in step (g). According to an alternative exemplary embodiment of the second aspect, the method can include the steps of: (u) supplying a first voltage signal to step (f); (v) supplying a second voltage signal to step (o); and (w) modifying the first and/or second voltage signals supplied in steps (u) and (v), respectively, to alter the maximum signals output in steps (g) and (p), respectively.

According to the second aspect, the method can include the steps of: (z) generating the bias signal for steps (e) and (n); (aa) controlling step (z) to alter the bias signal generated in step (z); (bb) combining the transmit signal components at the first and second polarities to form the differential signal; and (cc) transmitting the differential signal via a communication channel. Step (z) can be configured to maintain linear operation of steps (g) and (p) throughout associated swings in output voltages. The differential signal can comprise a gigabit Ethernet signal. Step (f) can comprise the step of: (f1) differentially amplifying the bias control signal and the second feedback signal to generate the third signal. Step (o) can comprise the step of: (o1) differentially amplifying the bias control signal and the fourth feedback signal to generate the sixth signal. The method can be compatible with any suitable wireless or wired standard, including, for example, 10BASE-T, 100BASE-T, 100BASE-TX, 1000BASE-T, 10GBASE-T or the like.

According to a third aspect of the present invention, a transmitter includes a first polarity driver circuit configured to generate a first component signal of a differential signal at a first polarity. The first polarity driver circuit includes a first current device and a first gain circuit. The first gain circuit is arranged in a feedback configuration with the first current device. The first gain circuit is configured to receive an input signal and to generate an amplified input signal. The first polarity driver circuit includes a first cascode element. The first cascode element is arranged in a cascode configuration with the first current device. The first cascode element is configured to output the first component signal of the differential signal at the first polarity. The first polarity driver circuit includes a second gain circuit. The second gain circuit is arranged in a feedback configuration with the first cascode element. The second gain circuit is configured to receive a bias control signal and to generate an amplified bias control signal.

According to the third aspect, the transmitter includes a second polarity driver circuit configured to generate a second component signal of the differential signal at a second polarity. The second polarity driver circuit includes a second current device and a third gain circuit. The third gain circuit is arranged in a feedback configuration with the second current device. The third gain circuit is configured to receive the input signal and to generate an amplified input signal. The second polarity driver circuit includes a second cascode element. The second cascode element is arranged in a cascode configuration with the second current device. The second cascode element is configured to output the second component signal of the differential signal at the second polarity. The second polarity driver circuit includes a fourth gain circuit. The fourth gain circuit is arranged in a feedback configuration with the second cascode element. The fourth gain circuit is configured to receive the bias control signal and to generate an amplified bias control signal.

According to the third aspect, the transmitter can include a bias signal circuit in communication with the second and fourth gain circuits. The bias signal circuit can be configured to generate the bias signal for biasing the first polarity and second polarity driver circuits. The transmitter can include a bias signal control circuit in communication with the bias signal circuit. The bias signal control circuit can be configured to control the bias signal circuit to alter the bias signal. The transmitter can include an interface circuit in communication with the first polarity and second polarity driver circuits. The interface circuit can be configured to interface the gigabit transmitter to a communication channel. According to an exemplary embodiment of the third aspect, each of the first and second current devices can comprise a transistor arranged in one of a common-emitter and a common-source configuration. Each of the first and second cascode elements can comprise a transistor arranged in one of a common-base and a common-gate configuration. Each of the second and fourth gain circuits can comprise a differential amplifier. Alternatively, each of the second and fourth gain circuits can comprise a feedback amplifier.

According to the third aspect, the differential signal can comprise a gigabit Ethernet signal. The transmitter can comprise, for example, a gigabit transmitter. The transmitter can be compatible with any suitable wired or wireless standard, such as, for example, 10BASE-T, 100BASE-T, 100BASE-TX, 1000BASE-T or 10GBASE-T. The transmitter can be formed on a monolithic substrate. According to an exemplary embodiment of the third aspect, an Ethernet controller can comprise the transmitter. Alternatively, a digital-to-analog converter can comprise the transmitter.

According to a fourth aspect of the present invention, a communication device includes a first polarity means for driving. The first polarity driving means includes a first means for generating current, and a first means for amplifying. The first amplifying means is arranged in a feedback configuration with the first current generating means. The first amplifying means is configured to receive an input signal. The first polarity driving means includes a first means for cascoding. The first cascoding means is arranged in a cascode configuration with the first current generating means. The first polarity driving means includes a second means for amplifying. The second amplifying means is arranged in a feedback configuration with the first cascoding means. The second amplifying means is configured to receive a bias control signal.

According to the fourth aspect, the first polarity driving means can be configured to generate a transmit signal component of a differential signal at a first polarity. The first cascoding means can be configured to output the transmit signal component of the differential signal at the first polarity. The input signal can comprise an input voltage signal. The first amplifying means and the first current generating means can be configured to convert the input voltage signal into a corresponding current signal for supply to the first cascoding means. The second amplifying means can be configured to enhance a gain provided by the first cascoding means to increase an output impedance of the first polarity driving means. The second amplifying means can comprise an amplifier means selected from the group consisting of a means for differentially amplifying and a means for feedback amplifying. The first cascoding means can comprise a transistor means. The first current generating means can comprise a transistor means in communication with a resistive means. The communication device can include means for generating a bias signal for biasing the first polarity driving means. The bias signal generating means can be in communication with the second amplifying means. The communication device can include means for controlling the bias signal generating means to alter the bias signal. The controlling means can be in communication with the bias signal generating means.

According to the fourth aspect, the communication device can include a second polarity means for driving. The second polarity driving means can include a second means for generating current, and a third means for amplifying. The third amplifying means can be arranged in a feedback configuration with the second current generating means. The third amplifying means can be configured to receive the input signal. The second polarity driving means can include a second means for cascoding. The second cascoding means can be arranged in a cascode configuration with the second current generating means. The second polarity driving means can include a fourth means for amplifying. The fourth amplifying means can be arranged in a feedback configuration with the second cascoding means. The fourth amplifying means can be configured to receive the bias control signal.

According to the fourth aspect, the second polarity driving means can be configured to generate a transmit signal component of the differential signal at a second polarity. The second cascoding means can be configured to output the transmit signal component of the differential signal at the second polarity. The input signal can comprise an input voltage signal. The first amplifying means and the first current generating means can be configured to convert the input voltage signal into a corresponding current signal for supply to the first cascoding means. The third amplifying means and the second current generating means can be configured to convert the input voltage signal into a corresponding current signal for supply to the second cascoding means. Each of the second and fourth amplifying means can be configured to enhance a gain provided by the first and second cascoding means, respectively, to increase an output impedance of the first polarity and second polarity driving means, respectively. Each of the second and fourth amplifying means can comprise an amplifier means selected from the group consisting of a means for differentially amplifying and a means for feedback amplifying. Each of the first and second cascading means can comprise a transistor means. Each of the first and second current generating means can comprise a transistor means in communication with a resistive means. The communication device can include means for generating a bias signal for biasing the first polarity and second polarity driving means. The bias signal generating means can be in communication with the second and fourth amplifying means. The communication device can include means for controlling the bias signal generating means to alter the bias signal. The controlling means can be in communication with the bias signal generating means. The communication device can include means for interfacing the communication device to a communication channel. The interfacing means can be in communication with the first polarity and second polarity driving means. The first polarity driving means and the second polarity driving means can be arranged in a differential configuration to output a differential signal.

According to the fourth aspect, the communication device can include a means for generating voltage. The voltage generating means can be configured to supply a voltage to the second amplifying means. The voltage supplied by the voltage generating means can be modified to alter the maximum signal output by the first cascoding means. According to an alternative exemplary embodiment of the fourth aspect, the communication device can include first and second means for generating voltages configured to supply first and second voltages, respectively, to the second and fourth amplifying means, respectively. The first and/or second voltages supplied by the first and second voltage generating means, respectively, can be modified to alter the maximum signals output by the first and second cascoding means, respectively. Additionally, the bias signal generating means can be configured to maintain the linear operation of the first and second cascoding means throughout associated swings in output voltages.

According to the fourth aspect, the differential signal can comprise a gigabit Ethernet signal or the like. The communication device can be compatible with any suitable wired or wireless standard, such as, for example, 10BASE-T, 100BASE-T, 100BASE-TX, 1000BASE-T or 10GBASE-T. The communication device can be formed on a monolithic substrate. According to an exemplary embodiment of the first aspect, a gigabit transmitter can comprise the communication device. According to an alternative exemplary embodiment of the first aspect, an Ethernet controller can comprise the communication device.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIGS. 6A and 6B are flowcharts illustrating steps for transmitting information, in accordance with an exemplary embodiment of the present invention.

DETAILED DESCRIPTION OF THE PREFERRED EMBODIMENTS

Exemplary embodiments of the present invention are directed to a cascode gain boosting system and method that can be used with a transmitter, such as, for example, a gigabit transmitter, a transmitter in accordance with I.E.E.E. 802.3ab (incorporated by reference herein in its entirety), or any suitable type of transmitter. According to an exemplary embodiment, a transmission system includes a driver circuit. The driver circuit includes a first transistor configured to receive an input signal, and a second transistor configured to receive a bias signal. The first and second transistors are arranged in a cascode configuration. A gain circuit or amplifier is arranged in communication with the second transistor in a feedback configuration to provide enhanced gain for the second transistor. The amplifier is configured to receive the bias signal and a feedback signal from the second transistor, and output an amplified bias signal to the second transistor, thereby enhancing the gain of the second transistor. The second transistor is used to increase the output resistance of the driver circuit, and the output resistance is increased by the gain provided by the amplifier. The gain provided by the amplifier can be increased to compensate for low swings in output voltage. Consequently, the center tap voltage on the primary windings of an isolation transformer can be lowered. Such added gain boosting for the second transistor can provide additional stability to the cascode circuit at the node between the first and second transistors, even if the second transistor moves out of its linear operating range. Thus, exemplary embodiments of the present invention can be used in transmission systems for operating at very low center tap voltages.

Figure 1:
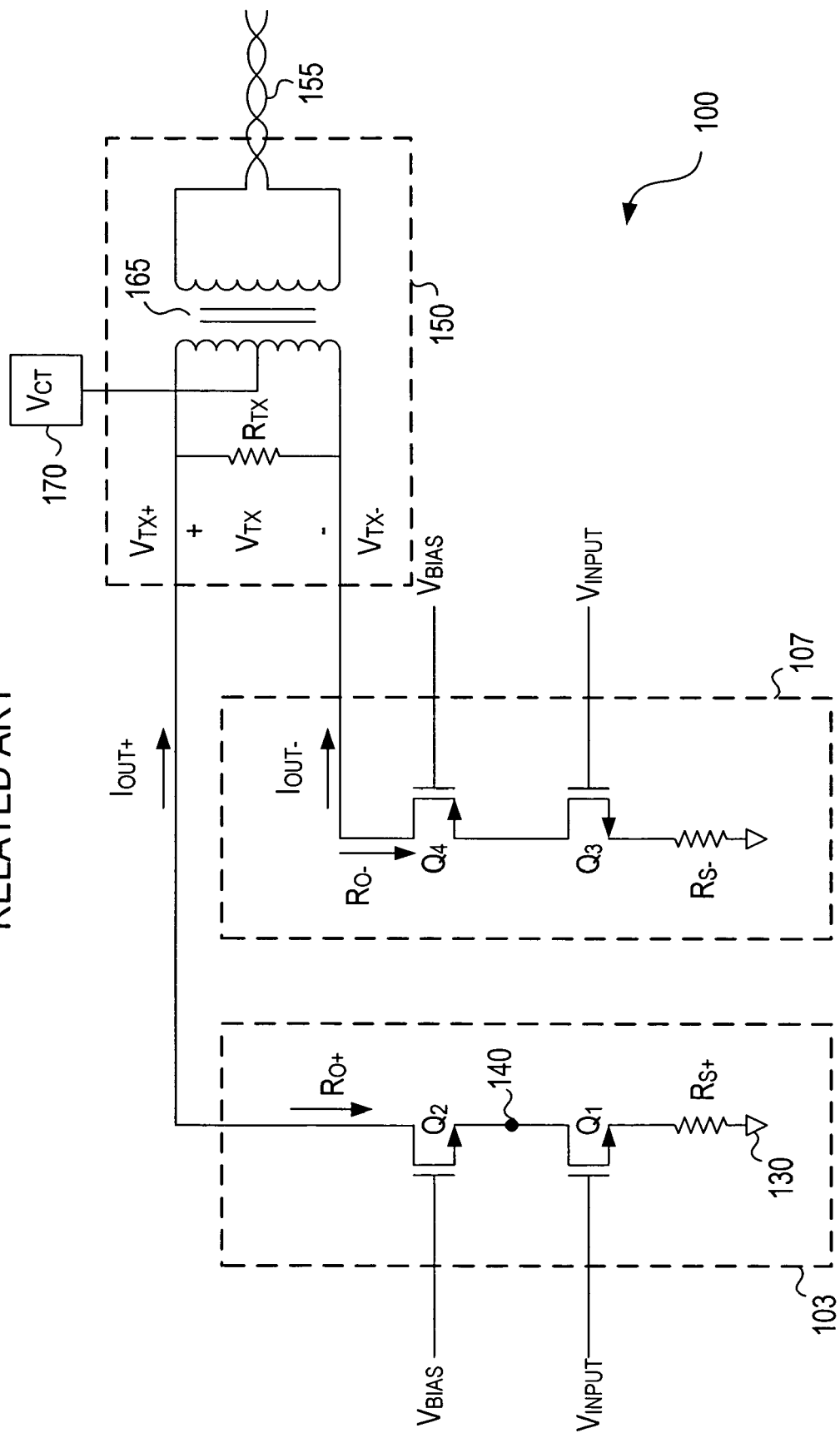
FIG. 1 is a diagram illustrating a transmission system.
Figure 2:
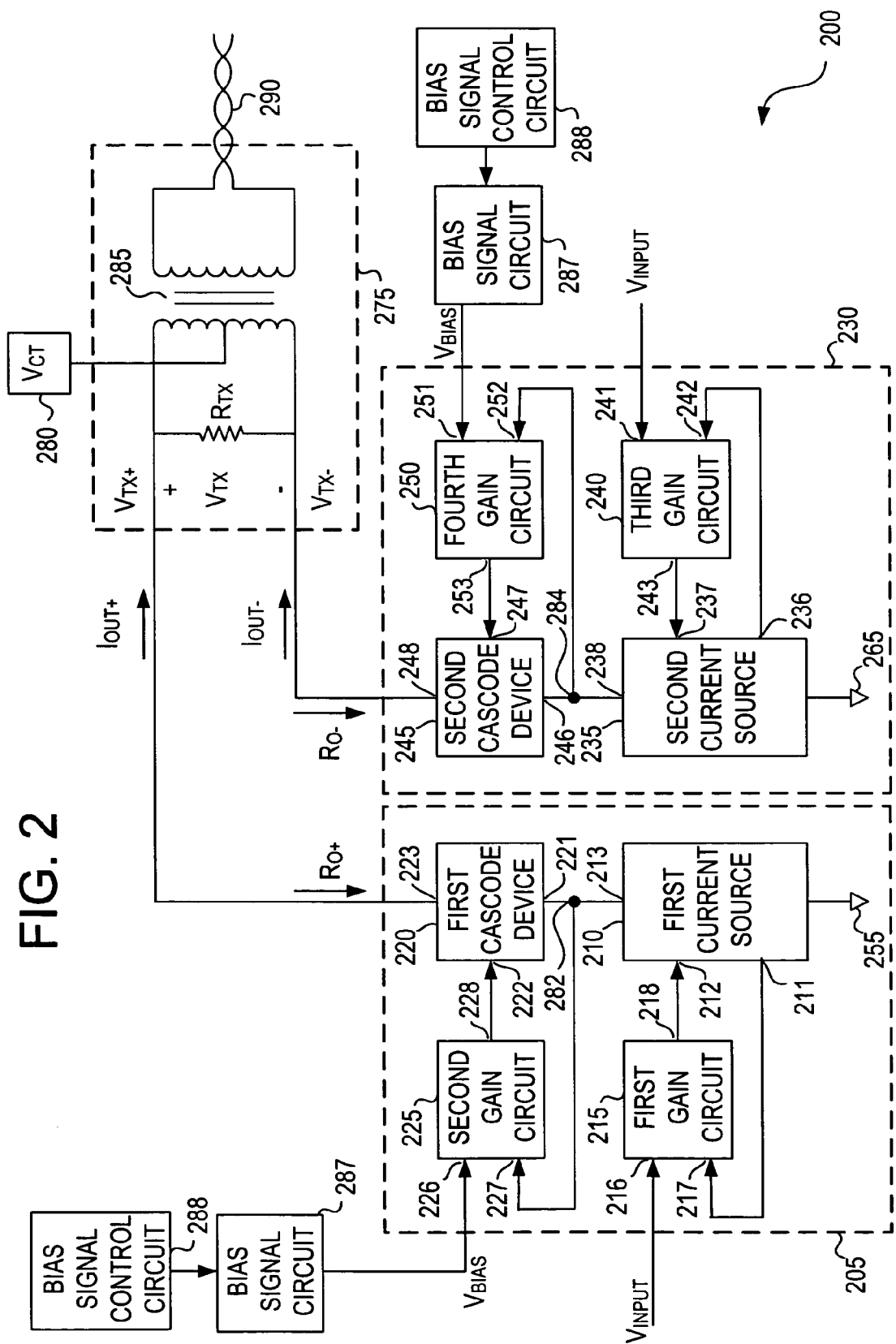
FIG. 2 is a diagram illustrating a signal transmission system, in accordance with an exemplary embodiment of the present invention.

These and other aspects of the present invention will now be described in greater detail. FIG. 2 is a diagram illustrating a signal transmission system 200 for transmitting, for example, a differential output signal (e.g., $I_{OUT}=I_{OUT+}-I_{OUT-}$), in accordance with an exemplary embodiment of the present invention. The signal transmission system 200 is illustrated in a differential configuration and includes a first polarity driver circuit 205. The first polarity driver circuit 205 is configured to generate, for example, a first component signal of a differential signal at a first polarity (e.g., $I_{OUT+}$). The first polarity driver circuit 205 includes a first current source 210 and can include a first gain circuit 215. The first gain circuit 215 is arranged in a feedback configuration with the first current source 210. The first gain circuit 215 is configured to receive an input signal, such as input voltage signal $V_{INPUT}$, and to generate an amplified input voltage signal 218. The first polarity driver circuit 205 includes a first cascode device 220. The first cascode device 220 is arranged in a cascode configuration with the first current source 210. The first cascode device 220 is configured to output, for example, the first component signal of the differential signal at the first polarity (e.g., $I_{OUT+}$). The first polarity driver circuit 205 includes a second gain circuit 225. The second gain circuit 225 is arranged in a feedback configuration with the first cascode device 220. The second gain circuit 225 is configured to receive a control signal, such as bias control signal $V_{BIAS}$, and to generate an amplified bias control signal 228.

According to exemplary embodiments, the first cascode device 220 is used to increase the output impedance $R_{O+}$ provided by the first polarity driver circuit 205 (i.e., the output impedance looking "down" into the first polarity driver circuit 205). The enhanced gain provided by the second gain circuit 225 amplifies the bias control signal $V_{BIAS}$, thereby enhancing the gain provided by the first cascode device 220 and the overall output impedance $R_{O+}$ of the first polarity driver circuit 205. For example, the gain provided by the second gain circuit 225 can be increased to compensate for very low swings in the output voltage. In other words, the cascode gain boosting can be used to drive the gain provided by the first cascode device 220 higher, even if the first cascode device 220 moves out of its linear operating range. Consequently, the enhanced gain provided by the addition of the second gain circuit 225 in the first polarity driver circuit 205 is used to maintain the linearity of the operation of the first polarity driver circuit 205 over large swings of output voltage.

The first current source 210 includes a first terminal 211, a second terminal 212 (e.g., on which to receive amplified input voltage signal 218), and a third terminal 213. The first terminal 211 is in electrical communication with a reference voltage 255 (e.g., a ground).

The first gain circuit 215 includes a fourth terminal 216 (e.g., on which to receive input voltage signal $V_{INPUT}$), a fifth terminal 217 and an output (e.g., a sixth terminal). The fourth terminal 216 is configured to receive the input voltage signal $V_{INPUT}$. The fifth terminal 217 is in electrical communication with the first terminal 211 of the first current source 210, thereby providing the feedback to the first gain circuit 215. According to exemplary embodiments, the signal fed back to the first gain circuit 215 (through fifth terminal 217) effectively tracks the input voltage signal $V_{INPUT}$. The output of the first gain circuit is in electrical communication with the second terminal 212 of the first current source 210, and configured to supply the amplified input voltage signal 218 to the first current source 210. According to exemplary embodiments, the first gain circuit 215 and the first current source 210 form a voltage-to-current converter for converting the input voltage signal $V_{INPUT}$ to a corresponding current signal.

The first cascode device 220 includes a seventh terminal 221, an eighth terminal 222 (e.g., on which to receive amplified bias control signal 228), and a ninth terminal 223. The seventh terminal 221 is in electrical communication with the third terminal 213 of the first current source 210, thereby forming a cascode configuration. The ninth terminal 223 is configured to output, for example, the first component signal of the differential signal at the first polarity (e.g., $I_{OUT+}$).

The second gain circuit 225 includes a tenth terminal 226, an eleventh terminal 227, and an output (e.g., a twelfth terminal). The tenth terminal 226 is configured to receive the bias control signal $V_{BIAS}$. The eleventh terminal 227 is in electrical communication with the seventh terminal 221 of the first cascode device 220, thereby providing the feedback to the second gain circuit 225. The output is in electrical communication with the eighth terminal 222 of the first cascode device 220, and configured to supply the amplified bias control signal 228 to the first cascode device 220.

As discussed in more detail below, the signal transmission system 200 can include a bias signal circuit 287 in electrical communication with the second gain circuit 225. The bias signal circuit 287 can be configured to generate the bias control signal $V_{BIAS}$ for biasing the first polarity driver circuit 205. The signal transmission system 200 can also include a bias signal control circuit 288 in electrical communication with the bias signal circuit 287. The bias signal control circuit 288 can be configured to control the bias signal circuit 287 to alter the bias control signal $V_{BIAS}$.

According to an exemplary embodiment, the first and second gain circuits 215 and 225 can be similar or different types of gain circuits. In such a configuration, the first and second gain circuits 215 and 225 can provide any suitable respective gains. For example, for purposes of illustration and not limitation, the first gain circuit 215 can provide a gain that is higher than that provided by the second gain circuit 225. According to an alternative exemplary embodiment, the first and second gain circuits 215 and 225 can be the same type of gain circuit, with the gain circuit providing same or different appropriate respective gains for amplifying the input voltage signal $V_{INPUT}$ and bias control signal $V_{BIAS}$.

A second polarity driver circuit 230 comprises elements and a configuration similar to that of first polarity driver circuit 205. The second polarity driver circuit 230 also operates in a manner that is comparable to that of first polarity driver circuit 205, to output, for example, a negative component signal of the differential output current signal (e.g., $I_{OUT-}$), and no further discussion will be provided.

Figure 3:
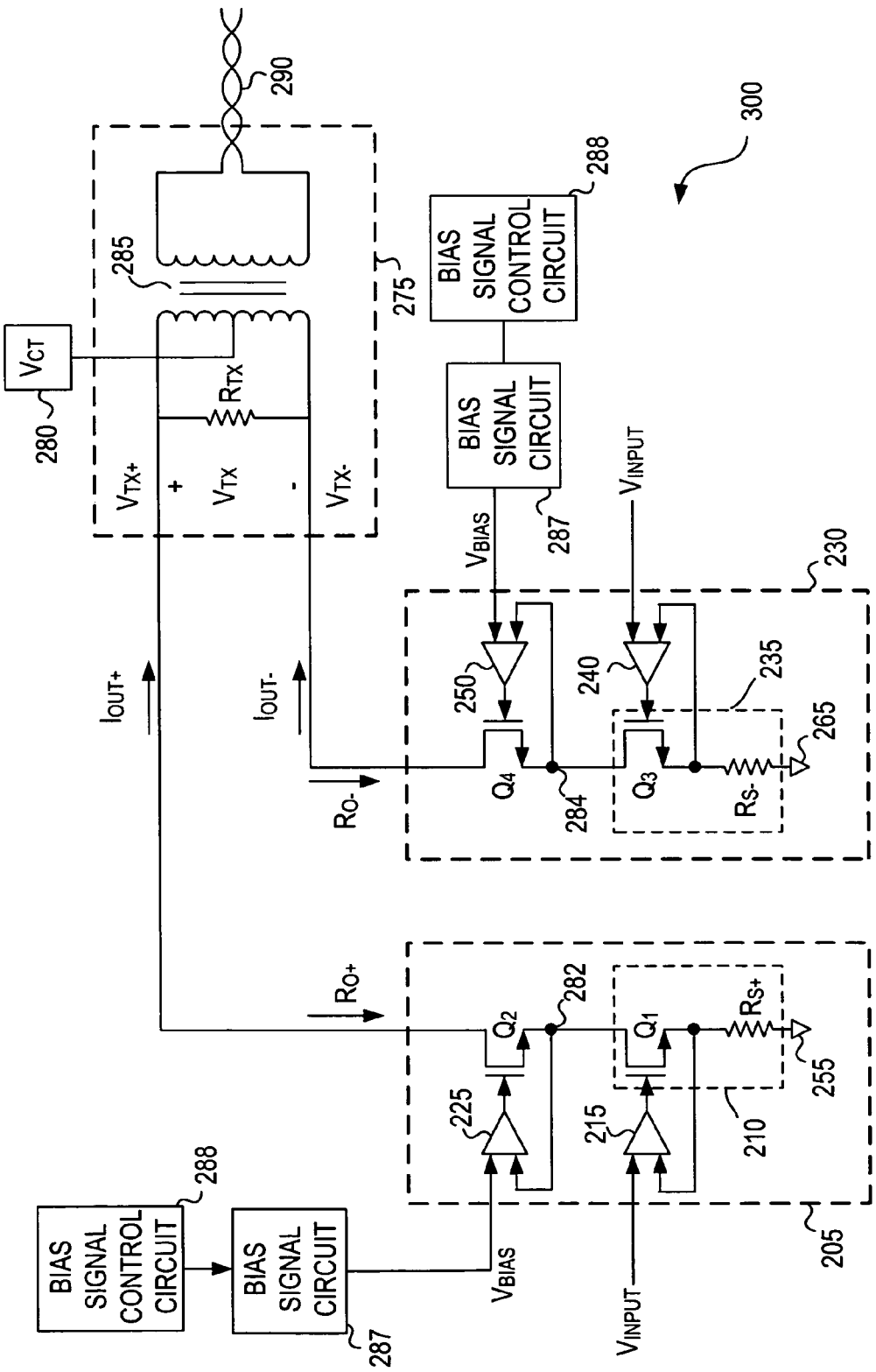
FIG. 3 is a diagram illustrating a signal transmission system for transmitting a differential output signal, in accordance with an exemplary embodiment of the present invention.

According to exemplary embodiments, each of the first current source 210 and the first cascode device 220 can comprise any suitable type of transistor or other appropriate amplification device, including, but not limited to, a bipolar junction transistor (BJT), a field-effect transistor (FET), a metal-oxide-semiconductor field-effect transistor (MOSFET) or the like. Merely for purposes of illustration and not limitation, FIG. 3 is a diagram illustrating a signal transmission system 300 for transmitting, for example, a differential output signal, in accordance with an exemplary embodiment of the present invention. As illustrated in FIG. 3, the first current source 210 has been implemented with a corresponding FET and a load, such as, for example, source resistor $R_{S+}$. The first cascode device 220 has also been implemented with a corresponding FET. In other words, first current source 210 can be implemented with a first transistor $Q_1$ with a source resistor $R_{S+}$, and the first cascode device 220 can be implemented with a second transistor $Q_2$. Additionally, the first gain circuit 215 and the second gain circuit 225 can each be implemented with any suitable type of amplifier. For the cascode configuration illustrated in FIG. 3, the first transistor $Q_1$ is arranged in a common-source configuration, while the second transistor $Q_2$ is arranged in a common-gate configuration. It is to be noted that if BJTs were used instead of FETs, then the first transistor $Q_1$ would be arranged in a common-emitter configuration, while the second transistor $Q_2$ would be arranged in a common-base configuration. In other words, the configuration of each of the transistors in the cascode arrangements will depend on factors such as, for example, the type of transistor used.

It is again noted that the second polarity driver circuit 230 can comprise elements and a configuration similar to that of first polarity driver circuit 205 as illustrated in FIG. 3. The second polarity driver circuit 230 can also operate in a manner that is comparable to that of first polarity driver circuit 205 as illustrated in FIG. 3, to output, for example, the negative component signal of the differential output current signal (e.g., $I_{OUT-}$).

For purposes of illustration, denote the gain of the first transistor $Q_1$ as $A_1$, which can include the corresponding gain from the first gain circuit 215 (from the amplified input voltage signal). Additionally, denote the gain of the second gain circuit 225 as $A_G$ and the gain of the second transistor $Q_2$ as $A_2$. Thus, the total gain from the second transistor $Q_2$ can be denoted as $A_2'=(A_2)(A_G)$. Consequently, the output impedance $R_{O+}$ of the first polarity driver circuit 205 (i.e., the output impedance looking "down" into the first polarity driver circuit 205) is given as: $R_{O+}=(A_1)(A_2')R_{S+}=(A_1)(A_2)(A_G)R_{S+}$. According to exemplary embodiments, the enhanced gain provided by the second gain circuit 225 amplifies the bias control signal $V_{BIAS}$, thereby enhancing the gain of the second transistor $Q_2$ and the overall output impedance $R_{O+}$ of the first polarity driver circuit 205. A similar result is obtained for the output impedance $R_{O-}$ of the second polarity driver circuit 230.

As discussed previously, the enhanced gain provided by the addition of the second gain circuit 225 in the first polarity driver circuit 205 provides a system for maintaining the linearity of the operation of the first polarity driver circuit 205. According to exemplary embodiments, the center tap voltage $V_{CT}$ 280 can be lowered, even for output signals with large voltage swings. The gain provided by the second gain circuit 225 can be increased to compensate for very low swings in the output voltage. The system can be configured, for example, to maintain the amplitude of the voltage at node 282 (located between first and second transistors $Q_1$ and $Q_2$) substantially constant over large swings of output voltage. Thus, the cascode gain boosting provided by exemplary embodiments of the present invention can be used to drive the corresponding gain higher, even if the second transistor $Q_2$ moves out of its linear operating range.

Figure 4:
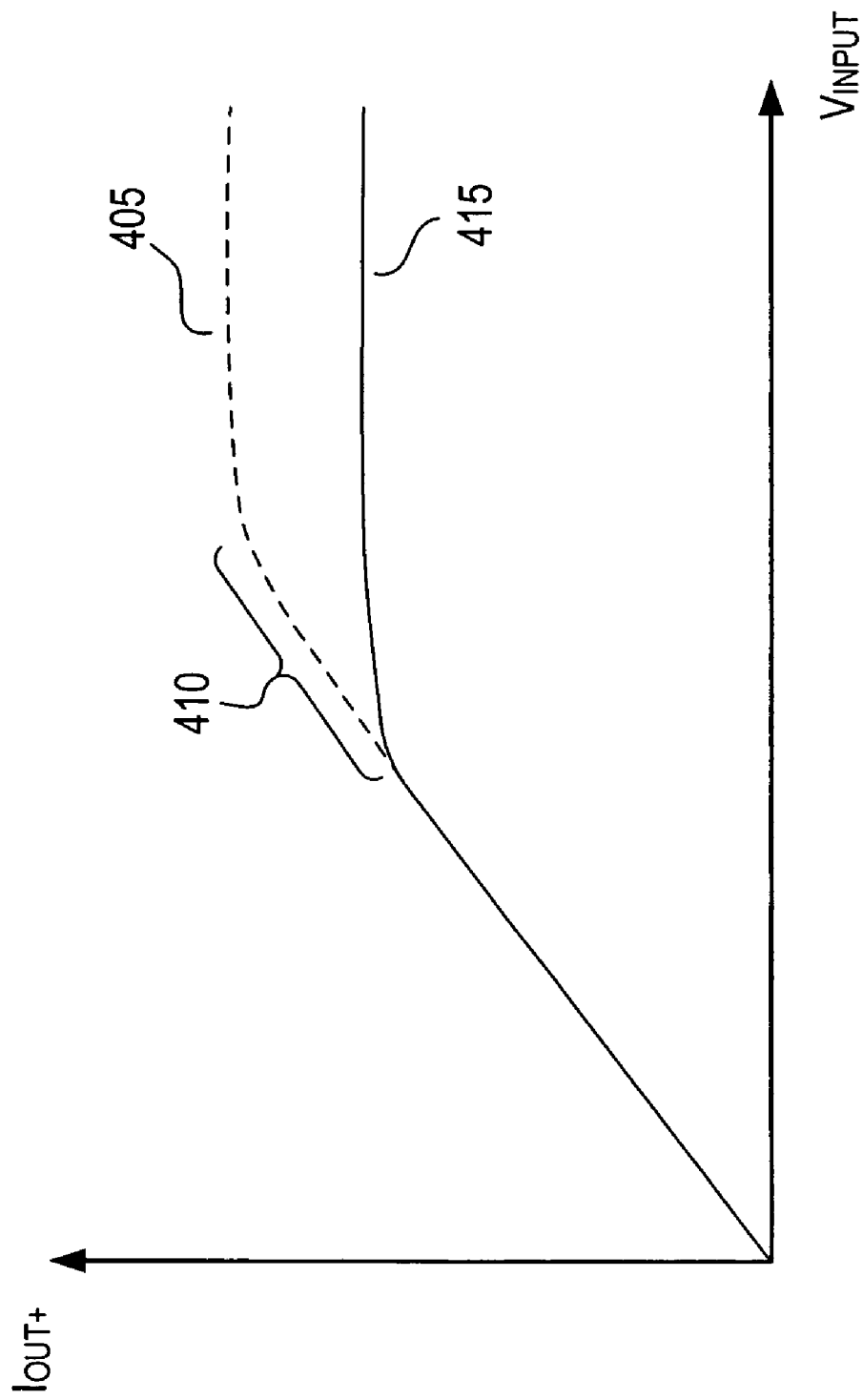
FIG. 4 is a graph illustrating the extension in linear operating range of the first polarity driver circuit resulting from the addition of the second gain circuit, in accordance with an exemplary embodiment of the present invention.

FIG. 4 is a graph illustrating the extension in linear operating range of the first polarity driver circuit 205 resulting from the addition of the second gain circuit 225, in accordance with an exemplary embodiment of the present invention. As can be seen, with the additional gain boosting (graph line 405), an extension 410 in the linear operating range of the first polarity driver circuit 205 can be achieved over a driver circuit that does not include the additional gain boosting (graph line 415). Similar results apply to the second polarity driver circuit 230 (resulting from the addition of the fourth gain circuit 250). Accordingly, the center tap voltage $V_{CT}$ 280 on the primary windings of the isolation transformer 285 can be lowered. Thus, exemplary embodiments of the present invention can be used in transmission systems, transceivers, Ethernet controllers and other like driver circuits for operating at very low center tap voltages.

Figure 5B:
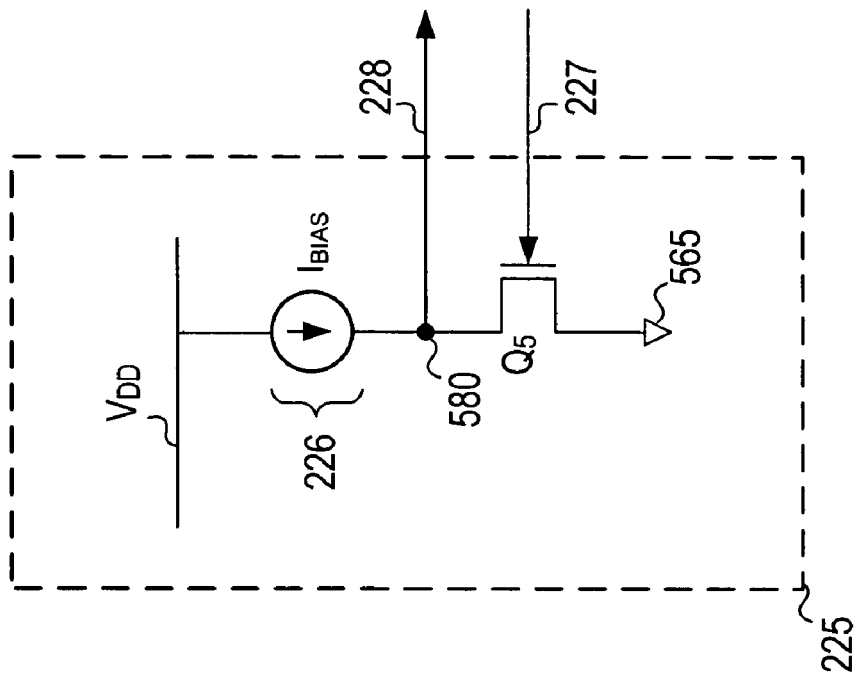
FIGS. 5A and 5B are diagrams illustrating a differential amplifier arrangement and a feedback amplifier arrangement, respectively, for each of the second and fourth gain circuits, respectively, in accordance with an exemplary embodiment of the present invention.
Figure 5A:
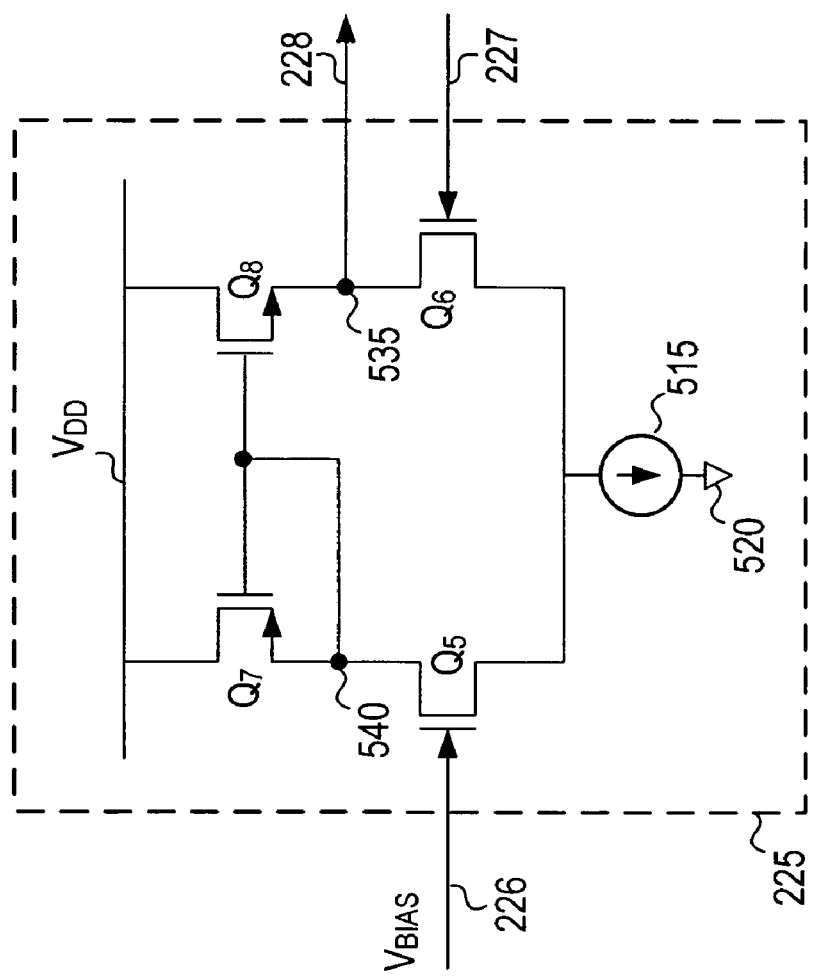

According to an exemplary embodiment of the present invention, the second gain circuit 225 can comprise any suitable type of amplifier, such as, for example, a differential amplifier. For example, FIG. 5A is a diagram illustrating a differential amplifier arrangement for the second gain circuit 225, in accordance with an exemplary embodiment of the present invention. For purposes of illustration and not limitation, FETs have been used for the transistors in the differential amplifier illustrated FIG. 5A. However, any suitable type of transistor can be used. Additionally, similar elements and configuration to that illustrated in FIG. 5A can be used for the fourth gain circuit 250 of the second polarity driver circuit 230.

As illustrated in FIG. 5A, the gate electrode of a fifth transistor $Q_5$ can form the tenth terminal 226 of the second gain circuit 225 to which the bias control signal $V_{BIAS}$ is applied. The gate electrode of a sixth transistor $Q_6$ can form the eleventh terminal 227 of the second gain circuit 225 to which the feedback signal from the first cascode device 220 is applied. The source electrodes of the fifth and sixth transistors $Q_5$ and $Q_6$ can be in electrical communication with each other and a current source 515, which is in electrical communication with a reference voltage 520 (e.g., a ground). The drain electrode of the fifth transistor $Q_5$ can be in electrical communication with the source electrode of a seventh transistor $Q_7$. The drain electrode of the sixth transistor $Q_6$ can be in electrical communication with the source electrode of an eighth transistor $Q_8$. A node 535, formed in the electrical connection between the drain electrode of the sixth transistor $Q_6$ and the source electrode of the eighth transistor $Q_8$, can form the output of the second gain circuit 225 for outputting the amplified bias control signal 228. The gate electrode of the seventh transistor $Q_7$ can be in electrical communication with the gate electrode of the eighth transistor $Q_8$, with both gate electrodes in electrical communication with a node 540 formed in the electrical connection between the drain electrode of the fifth transistor $Q_5$ and the source electrode of the seventh transistor $Q_7$. The drain electrodes of the seventh and eighth transistors $Q_7$ and $Q_8$ can be in electrical communication with an appropriate voltage supply, $V_{DD}$.

According to an alternative exemplary embodiment of the present invention, the second gain circuit 225 can comprise any suitable type of feedback amplifier. FIG. 5B is a diagram illustrating a feedback amplifier arrangement for the second gain circuit 225, in accordance with an alternative exemplary embodiment of the present invention. For purposes of illustration and not limitation, FETs have been used for the transistors illustrated FIG. 5B. However, any suitable type of transistor can be used. Additionally, similar elements and configuration to that illustrated in FIG. 5B can be used for the fourth gain circuit 250 of the second polarity driver circuit 230.

As illustrated in FIG. 5B, the gate electrode of a fifth transistor $Q_5$ can form the eleventh terminal 227 of the second gain circuit 225 to which the feedback signal from the first cascode device 220 is applied. The source electrode of the fifth transistor $Q_5$ can be in electrical communication with a reference voltage 565 (e.g., a ground). A current source $I_{BIAS}$, in electrical communication with the drain electrode of the fifth transistor $Q_5$, can be used to supply the bias control signal $V_{BIAS}$ to the second gain circuit 225. The current source $I_{BIAS}$ can be in electrical communication with an appropriate voltage supply, $V_{DD}$. A node 580, formed in the electrical connection between the drain electrode of the fifth transistor $Q_5$ and current source $I_{BIAS}$ can form the output of the second gain circuit 225 for outputting the amplified bias control signal 228. According to exemplary embodiments, the fifth transistor $Q_5$ acts as a feedback amplifier to sense the voltage at node 282 (see FIGS. 2 and 3) and provide amplification for the bias control signal $V_{BIAS}$. Additionally, the current source $I_{BIAS}$ can be tuned to achieve the appropriate headroom for the first polarity driver circuit 205. In other words, the current source $I_{BIAS}$ can be tuned so that there is sufficient headroom for the voltage at node 282 for the worst-case operating scenario of first current source 210.

Figure 7A:
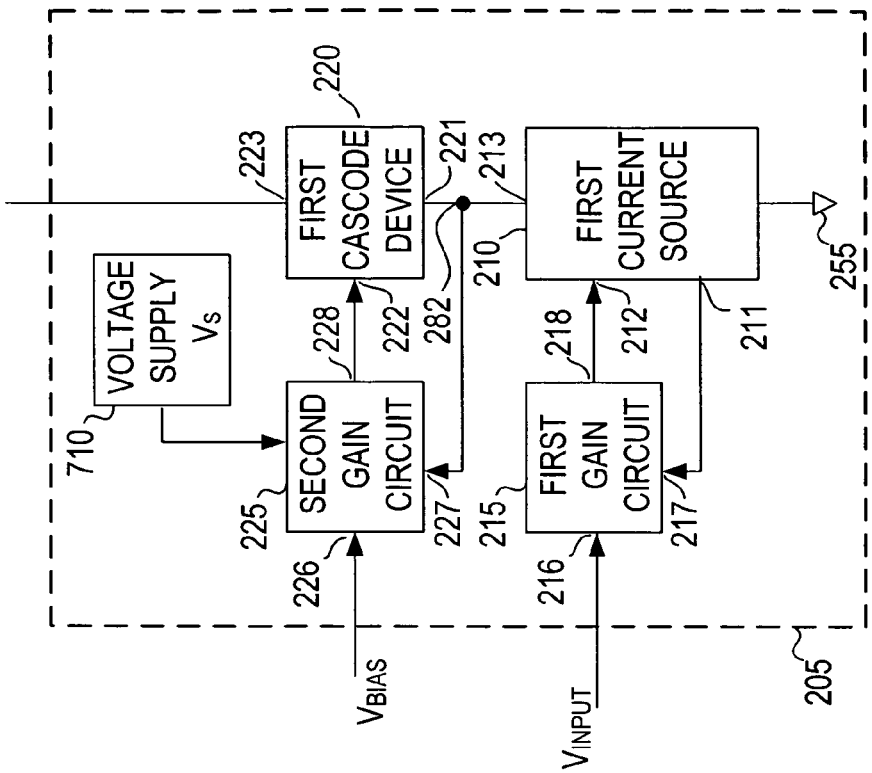
FIGS. 7A and 7B are diagrams illustrating the first polarity driver circuit with alternative voltage supplies for supplying a voltage to the second gain circuit, in accordance with an exemplary embodiment of the present invention.
Figure 7B:
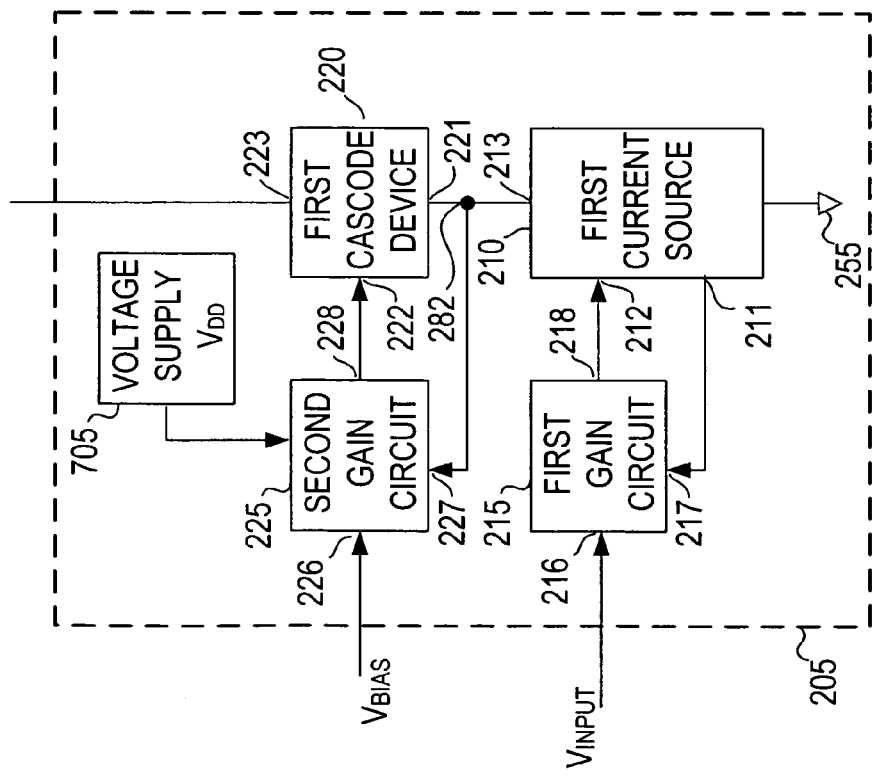

According to exemplary embodiments, the voltage supply for the second gain circuit 225 can be altered to change the maximum output to which the first cascode device 220 can be driven. FIG. 7A is a diagram illustrating the first polarity driver circuit 205 with a voltage supply 705 for supplying a voltage $V_{DD}$ to the second gain circuit 225, in accordance with an exemplary embodiment of the present invention. Accordingly, the output of the first cascode device 220 illustrated in FIG. 7A can be driven to a maximum voltage $V_{DD}$ while maintaining the linearity of the operation of the first cascode device 220 and the first polarity driver circuit 205 over corresponding swings of output voltage. However, FIG. 7B is a diagram illustrating the first polarity driver circuit 205 with a voltage supply 710 for supplying a voltage $V_S$ to the second gain circuit 225, in accordance with an alternative exemplary embodiment of the present invention. For example, the voltage $V_S$ supplied to the second gain circuit 225 as illustrated in FIG. 7B can be greater than the voltage $V_{DD}$ supplied to the second gain circuit 225 as illustrated in FIG. 7A, although voltage $V_S$ can be greater than or less than voltage $V_{DD}$. Accordingly, the output of the first cascode device 220 illustrated in FIG. 7B can be driven to a maximum voltage $V_S > V_{DD}$ to achieve greater swings in output voltage, while still maintaining the linearity of the operation of the first cascode device 220 and the first polarity driver circuit 205. Any suitable type of voltage source or supply can be used for either voltage supply 705 or voltage supply 710. It is again noted that such alternative arrangements of voltage supplies can be used for the second polarity driver circuit 230.

Referring again to FIG. 2, the signal transmission system 200 can include one or more bias signal circuits 287 in electrical communication with the second and fourth gain circuits 225 and 250. The bias signal circuits 287 can be configured to generate the bias control signals $V_{BIAS}$ for biasing the first polarity and second polarity driver circuits 205 and 230. For example, a single bias signal circuit 287 can be used to generate bias control signals $V_{BIAS}$ for both the second and fourth gain circuits 225 and 250. Alternatively, individual bias signal circuits 287 can be used to generate respective bias control signals $V_{BIAS}$ for each of the second and fourth gain circuits 225 and 250. The bias signal circuits 287 can generate the bias control signals $V_{BIAS}$ in any suitable manner. The signal transmission system 200 can also include one or more bias signal control circuits 288 in electrical communication with the respective bias signal circuits 287. The bias signal control circuits 288 can be configured to control the bias signal circuits 287 to alter the bias control signals $V_{BIAS}$. For example, the bias signal control circuits 288 can control the bias signal circuits 287 to generate the respective bias control signals $V_{BIAS}$ such that there is sufficient headroom for the voltages at nodes 282 and 284 for the worst-case operating scenarios of first and second current sources 210 and 235. For example, a single bias signal control circuit 288 can be used to control one or more bias signal circuits 287. Alternatively, individual bias signal control circuits 288 can be used to control respective bias signal circuits 287.

The signal transmission system 200 can include an interface circuit 275 in electrical communication with the first polarity and second polarity driver circuits 205 and 230. The interface circuit 275 is configured to interface the first polarity and second polarity driver circuits 205 and 230 to a communication channel. The communication channel can be any suitable type of communication channel capable of transmitting electrical information, such as a UTP 290, or any other suitable wired or wireless communication channel. The interface circuit 275 can include one or more resistors $R_{TX}$. The resistor $R_{TX}$ is arranged in parallel across the primary windings of the isolation transformer 285, with the secondary windings coupled to the UTP 290. The isolation transformer 285 includes a center tap on the primary windings with a DC center tap voltage, $V_{CT}$ 280.

The first and second current sources 210 and 235, the first and second cascode devices 220 and 245, the first, second, third and fourth gain circuits 215, 225, 240 and 250, the bias signal circuits 287, and the bias signal control circuits 288 can each be implemented using any suitable electrical or electronic device capable of performing the functions associated with the respective element. Additionally, at least the first and second current sources 210 and 235, the first and second cascode devices 220 and 245, and the first, second, third and fourth gain circuits 215, 225, 240 and 250 can be formed on a monolithic substrate. In other words, any combination or all of the elements of the first polarity and second polarity driver circuits 205 and 230 can be constructed of common integrated circuit elements and can be implemented on a single chip along with the remaining components of, for example, a high speed bidirectional communication transceiver or the like. In accordance with an exemplary embodiment of the present invention, the transformer or hybrid portion of the interface circuit 275 is contemplated as an off-chip circuit element. Even though the exemplary embodiment contemplates the transformer being provided off-chip, it will be understood by skilled artisans familiar with integrated circuit design and fabrication that suitable transformers can be constructed from integrated circuit elements, such as combinations of spiral inductors and the like, and still provide sufficient DC coupling between the communication channel and an integrated circuit transceiver.

While the first polarity and second polarity driver circuits 205 and 230 have been described in terms of integrated circuit technology implementing, for example, a four-pair gigabit-type Ethernet transceiver or the like, it will be evident to one having ordinary skill in the art that the invention can be suitably implemented in other semiconductor technologies, such as bipolar, bi-CMOS, and the like, as well as be portable to other forms of bidirectional communication devices that operate in, for example, full duplex mode. According to an alternative exemplary embodiment, each component or device of the first polarity and second polarity driver circuits 205 and 230 can be formed on, for example, a separate substrate and can be in communication with another component or device using any appropriate type of electrical connection that is capable of carrying electrical information. In other words, the circuitry according to exemplary embodiments of the present invention can be constructed from discrete components as opposed to a monolithic circuit.

The signal transmission system 200 according to exemplary embodiments can be compatible with any suitable wireless or wired transmission protocol or network standard, such as, for example, 10BASE-T, 100BASE-T, 100BASE-TX, 1000BASE-T, 10GBASE-T or the like. For example, the first polarity and second polarity driver circuits 205 and 230 can be configured to accommodate the 1.0 V output swings characteristic of 1000BASE-T operation, or the 2.5 V output swings characteristic of 10BASE-T operation. For example, in 1000BASE-T (gigabit Ethernet), the differential transmit signal can comprise a gigabit Ethernet signal. According to an alternative exemplary embodiment, the signal transmission system 200 can be used to transmit or otherwise communicate single-ended (i.e., non-differential) signals.

FIGS. 6A and 6B are flowcharts illustrating steps for transmitting information, in accordance with an exemplary embodiment of the present invention. Referring to FIG. 6A, to generate a first transmit signal component of a differential signal at a first polarity, in step 602, an input signal (e.g., input voltage signal $V_{INPUT}$) is received (e.g., by first gain circuit 215). In step 604, the input signal is amplified (e.g., by first gain circuit 215) to generate a first signal (e.g., the signal applied to first current source 210). In step 606, the first signal is amplified (e.g., by first current source 210) to supply a second signal (e.g., the signal supplied to first cascode device 220). In step 608, a first feedback signal is supplied from step 606 (e.g., from the first current source 210) to step 604 (e.g., to the first gain circuit 215). In step

610, a bias control signal (e.g., bias control signal $V_{BIAS}$) is received (e.g., by second gain circuit 225). In step 612, the bias control signal is amplified (e.g., by second gain circuit 225) to generate a third signal (e.g., the signal applied to the first cascode device 220).

In step 614, the second signal (e.g., from first current source 210) is amplified (e.g., by first cascode device 220) in accordance with the third signal to generate the first transmit signal component of the differential signal at the first polarity. In step 616, a second feedback signal is supplied from step 614 (e.g., from the first cascode device 220) to step 612 (e.g., to the second gain circuit 225). In accordance with an exemplary embodiment, step 616 can include the step 618 of modifying the level of amplification provided in step 612 (e.g., by second gain circuit 225) to maintain the amplitude of the second feedback signal (e.g., at node 282) substantially constant.

Again referring to FIG. 6A, to generate a second transmit signal component of the differential signal at a second polarity, in step 603, an input signal (e.g., input voltage signal $V_{INPUT}$) is received (e.g., by third gain circuit 240). In step 605, the input signal is amplified (e.g., by third gain circuit 240) to generate a fourth signal (e.g., the signal applied to second current source 235). In step 607, the fourth signal is amplified (e.g., by second current source 235) to supply a fifth signal (e.g., the signal supplied to second cascode device 245). In step 609, a third feedback signal is supplied from step 607 (e.g., from the second current source 235) to step 605 (e.g., to the third gain circuit 240). In step 611, the bias control signal (e.g., bias control signal $V_{BIAS}$) is received (e.g., by fourth gain circuit 250). In step 613, the bias control signal is amplified (e.g., by fourth gain circuit 250) to generate a sixth signal (e.g., the signal applied to the second cascode device 245).

In step 615, the fifth signal (e.g., from second current source 235) is amplified (e.g., by second cascode device 245) in accordance with the sixth signal to generate the second transmit signal component of the differential signal at the second polarity. In step 617, a fourth feedback signal is supplied from step 615 (e.g., from the second cascode device 245) to step 613 (e.g., to the fourth gain circuit 250). In accordance with an exemplary embodiment, step 617 can include the step 619 of modifying the level of amplification provided in step 613 (e.g., by fourth gain circuit 250) to maintain the amplitude of the fourth feedback signal (e.g., at node 284) substantially constant.

In FIG. 7B, in step 620, the first transmit signal component of the differential signal is output (e.g., by first cascode device 220). In step 621, the second transmit signal component of the differential signal is output (e.g., by the second cascode device 245). In step 630, the first and second transmit signal components are combined to form the differential signal. In step 635, the differential signal is transmitted via a communication channel (e.g., via UTP 290). The differential signal can comprise, for example, a gigabit Ethernet signal or the like. According to an exemplary embodiment, the method can include the step of generating the bias signal for steps 610 and 611 (e.g., by bias signal circuit 287). The method can also include the step of controlling the generation of the bias control signal $V_{BIAS}$ (e.g., by bias signal control circuit 288) to alter the bias control signal $V_{BIAS}$. According to an exemplary embodiment, step 612 can include the step of differentially amplifying the bias control signal $V_{BIAS}$ and the second feedback signal to generate the third signal (e.g., using the differential amplifier illustrated in FIG. 5A). Furthermore, step 613 can include the step of differentially amplifying the bias control signal $V_{BIAS}$ and the fourth feedback signal to generate the sixth signal (e.g., using the differential amplifier illustrated in FIG. 5A). According to an alternative exemplary embodiment, the method can be used to transmit or otherwise communicate single-ended (i.e., non-differential) signals. According to exemplary embodiments, the method of transmitting information illustrated in FIGS. 6A and 6B can be compatible with any suitable wireless or wired transmission protocol or network standard, including, for example, 10BASE-T, 100BASE-T, 100BASE-TX, 1000BASE-T, 10GBASE-T or the like.

Exemplary embodiments of the present invention can be used in any suitable application or system capable of communicating information, such as any appropriate form of transmitter or transceiver. For example, the signal transmission systems 200 and 300 illustrated in FIGS. 2 and 3, respectively, can be used with any suitable application, such as, for example, a digital-to-analog converter (DAC) or the like, that is capable of supplying the input voltage signal $V_{INPUT}$ to the first polarity and second polarity driver circuits 205 and 230 for transmission. For example, exemplary embodiments of the present invention can be used with the class B driver disclosed in U.S. Pat. No. 6,844,837, the entire contents of which are hereby incorporated by reference herein. The signal transmission systems 200 and 300 illustrated in FIGS. 2 and 3, in particular first polarity and second polarity driver circuits 205 and 230, can also form part of an Ethernet controller or transceiver or the like.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A communication device, comprising:
   a first polarity driver circuit,
      wherein the first polarity driver circuit comprises:
         a first current source;
         a first amplifier,
            wherein the first amplifier is arranged in a feedback configuration with the first current source, and
            wherein the first amplifier is configured to receive an input signal;
         a first cascode device,
            wherein the first cascode device is arranged in a cascode configuration with the first current source; and
         a second amplifier,
            wherein the second amplifier is arranged in a feedback configuration with the first cascode device, and
            wherein the second amplifier is configured to receive a bias control signal.

2. The communication device of claim 1, wherein the first polarity driver circuit is configured to generate a transmit signal component of a differential signal at a first polarity.

3. The communication device of claim 2, wherein the first cascode device is configured to output the transmit signal component of the differential signal at the first polarity.

4. The communication device of claim 1, wherein the input signal comprises an input voltage signal, and
   wherein the first amplifier and the first current source are configured to convert the input voltage signal into a corresponding current signal for supply to the first cascode device.

5. The communication device of claim 1, wherein the second amplifier is configured to enhance a gain provided by the first cascode device to increase an output impedance of the first polarity driver circuit.

6. The communication device of claim 1, wherein the second amplifier comprises an amplifier circuit selected from the group consisting of a differential amplifier and a feedback amplifier.

7. The communication device of claim 1, wherein the first cascode device comprises a transistor.

8. The communication device of claim 1, wherein the first current source comprises a transistor in communication with a load.

9. The communication device of claim 1, comprising:
a bias signal device in communication with the second amplifier,
wherein the bias signal device is configured to generate the bias signal for biasing the first polarity driver circuit.

10. The communication device of claim 9, comprising:
a bias signal control device in communication with the bias signal device,
wherein the bias signal control device is configured to control the bias signal circuit to alter the bias signal.

11. The communication device of claim 1, comprising:
a second polarity driver circuit,
wherein the second polarity driver circuit comprises:
a second current source;
a third amplifier,
wherein the third amplifier is arranged in a feedback configuration with the second current source, and
wherein the third amplifier is configured to receive the input signal;
a second cascode device,
wherein the second cascode device is arranged in a cascode configuration with the second current source; and
a fourth amplifier,
wherein the fourth amplifier is arranged in a feedback configuration with the second cascode device, and
wherein the fourth amplifier is configured to receive the bias control signal.

12. The communication device of claim 11, wherein the second polarity driver circuit is configured to generate a transmit signal component of the differential signal at a second polarity.

13. The communication device of claim 12, wherein the second cascode device is configured to output the transmit signal component of the differential signal at the second polarity.

14. The communication device of claim 11, wherein the input signal comprises an input voltage signal, and
wherein the first amplifier and the first current source are configured to convert the input voltage signal into a corresponding current signal for supply to the first cascode device, and
wherein the third amplifier and the second current source are configured to convert the input voltage signal into a corresponding current signal for supply to the second cascode device.

15. The communication device of claim 11, wherein each of the second and fourth amplifiers is configured to enhance a gain provided by the first and second cascode devices, respectively, to increase an output impedance of the first polarity and second polarity driver circuits, respectively.

16. The communication device of claim 11, wherein each of the second and fourth amplifiers comprises an amplifier circuit selected from the group consisting of a differential amplifier and a feedback amplifier.

17. The communication device of claim 11, wherein the each of the first and second cascode devices comprises a transistor.

18. The communication device of claim 11, wherein each of the first and second current source comprises a transistor in communication with a load.

19. The communication device of claim 11, comprising:
a bias signal device in communication with the second and fourth amplifiers,
wherein the bias signal device is configured to generate the bias signal for biasing the first polarity and second polarity driver circuits.

20. The communication device of claim 19, comprising:
a bias signal control device in communication with the bias signal device,
wherein the bias signal control device is configured to control the bias signal circuit to alter the bias signal.

21. The communication device of claim 11, comprising:
a interface device in communication with the first polarity and second polarity driver circuits,
wherein the interface device is configured to interface the communication device to a communication channel.

22. The communication device of claim 11, wherein the first polarity driver circuit and the second polarity driver circuit are arranged in a differential configuration to output a differential signal.

23. The communication device of claim 22, wherein the differential signal comprises a gigabit Ethernet signal.

24. The communication device of claim 11, wherein the communication device is compatible with a standard selected from the group consisting of 10BASE-T, 100BASE-T, 100BASE-TX, 1000BASE-T and 10GBASE-T.

25. The communication device of claim 11, wherein the communication device is formed on a monolithic substrate.

26. A gigabit transmitter, comprising the communication device of claim 1.

27. An Ethernet controller, comprising the communication device of claim 1.

28. A method of communicating information, comprising the steps of:
(a) receiving an input signal;
(b) amplifying the input signal to generate a first signal;
(c) amplifying the first signal from step (b) to supply a second signal;
(d) supplying a first feedback signal from step (c) to step (b);
(e) receiving a bias control signal;
(f) amplifying the bias control signal to generate a third signal;
(g) amplifying the second signal supplied from step (c) in accordance with the third signal; and
(h) supplying a second feedback signal from step (g) to step (f),
wherein step (h) comprises the step of:
(h1) modifying a level of amplification provided in step (f) to maintain an amplitude of the second feedback signal substantially constant.

29. The method of claim 28, wherein step (g) comprises the step of:
(g1) generating a transmit signal component of a differential signal at a first polarity.

30. The method of claim 29, comprising the step of:
(i) outputting the transmit signal component of the differential signal at the first polarity.

31. The method of claim 29, comprising the steps of:
(j) receiving the input signal;
(k) amplifying the input signal to generate a fourth signal;
(l) amplifying the fourth signal from step (k) to supply a fifth signal;
(m) supplying a third feedback signal from step (l) to step (k);
(n) receiving the bias control signal;
(o) amplifying the bias control signal to generate a sixth signal;
(p) amplifying the fifth signal supplied from step (l) in accordance with the sixth signal to generate a transmit signal component of the differential signal at a second polarity; and
(q) supplying a fourth feedback signal from step (p) to step (o),
wherein step (q) comprises the step of:
(q1) modifying a level of amplification provided in step (o) to maintain an amplitude of the fourth feedback signal substantially constant.

32. The method of claim 31, comprising the step of:
(r) outputting the transmit signal component of the differential signal at the second polarity.

33. The method of claim 31, comprising the step of:
(s) generating the bias signal for steps (e) and (n).

34. The method of claim 33, comprising the step of:
(t) controlling step (s) to alter the bias signal generated in step (s).

35. The method of claim 31, comprising the step of:
(u) combining the transmit signal components at the first and second polarities to form the differential signal.

36. The method of claim 35, comprising the step of:
(v) transmitting the differential signal via a communication channel.

37. The method of claim 36, wherein the differential signal comprises a gigabit Ethernet signal.

38. The method of claim 28, wherein step (f) comprises the step of:
(f1) differentially amplifying the bias control signal and the second feedback signal to generate the third signal.

39. The method of claim 31, wherein step (o) comprises the step of:
(o1) differentially amplifying the bias control signal and the fourth feedback signal to generate the sixth signal.

40. The method of claim 31, wherein the method is compatible with a standard selected from the group consisting of 10BASE-T, 100BASE-T, 100BASE-TX, 1000BASE-T and 10GBASE-T.

41. The communication device of claim 1, comprising:
a voltage source,
wherein the voltage source is configured to supply a voltage to the second amplifier.

42. The communication device of claim 41, wherein the voltage supplied by the voltage source is modified to alter a maximum signal output by the first cascode device.

43. The communication device of claim 9, wherein the bias signal device is configured to maintain linear operation of the first cascode device throughout associated swings in output voltage.

44. The method of claim 28, comprising the step of:
i.) supplying a voltage signal to step (f).

45. The method of claim 44, comprising the step of:
j.) modifying the voltage signal supplied by step (i) to alter a maximum signal output in step (g).

46. The method of claim 33, wherein step (s) is configured to maintain linear operation of steps (g) and (p) throughout associated swings in output voltages.

* * * * *

UNITED STATES PATENT AND TRADEMARK OFFICE
CERTIFICATE OF CORRECTION

| | | |
|---|---|---|
| PATENT NO. | : 7,312,662 B1 | Page 1 of 1 |
| APPLICATION NO. | : 11/214933 | |
| DATED | : December 25, 2007 | |
| INVENTOR(S) | : Pierte Roo et al. | |

It is certified that error appears in the above-identified patent and that said Letters Patent is hereby corrected as shown below:

On the Title Page

References      Item -56- Page 5, second column, "Radke et al;" delete "E$\Delta$" after "Current-Mode" and insert -- $\Sigma\Delta$ --

Column 12, Line 31      Insert -- in -- after "illustrated"

Column 18, Line 5      Delete "the" after "wherein"

Signed and Sealed this

Twenty-third Day of September, 2008

JON W. DUDAS
*Director of the United States Patent and Trademark Office*